US008973525B2

(12) United States Patent
Hong et al.

(10) Patent No.: US 8,973,525 B2

(45) Date of Patent: Mar. 10, 2015

(54) THIN FILM DEPOSITION APPARATUS

(75) Inventors: Jong-Won Hong, Yongin (KR); Seok-Rak Chang, Yongin (KR); Chang-Mog Jo, Yongin (KR); Young-Mook Choi, Yongin (KR); Jae-Kwang Ryu, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 661 days.

(21) Appl. No.: 13/014,225

(22) Filed: Jan. 26, 2011

(65) Prior Publication Data

US 2011/0220022 A1 Sep. 15, 2011

(30) Foreign Application Priority Data

Mar. 11, 2010 (KR) ........................ 10-2010-0021835

(51) Int. Cl.

*C23C 16/00* (2006.01)
*B05C 11/00* (2006.01)
*C23C 14/04* (2006.01)
*C23C 14/24* (2006.01)
*C23C 14/54* (2006.01)
*C23C 14/56* (2006.01)
*H01L 51/52* (2006.01)
*H01L 51/56* (2006.01)

(52) U.S. Cl.

CPC ............. *C23C 14/042* (2013.01); *C23C 14/243* (2013.01); *C23C 14/54* (2013.01); *C23C 14/568* (2013.01); *H01L 51/5253* (2013.01); *H01L 51/56* (2013.01)

USPC ......................... 118/663; 118/715; 427/248.1

(58) Field of Classification Search

None

See application file for complete search history.

(56) References Cited

U.S. PATENT DOCUMENTS 4,416,217 A 11/1983 Nakamura et al.
4,468,648 A 8/1984 Uchikune
4,687,939 A 8/1987 Miyauchi et al.

(Continued)

FOREIGN PATENT DOCUMENTS

CN 1476279 A 2/2004
CN 1489419 A 4/2004

(Continued)

OTHER PUBLICATIONS

KIPO Office action dated Feb. 6, 2012, for Korean Patent application 10-2010-0021835, 4 pages.

(Continued)

*Primary Examiner* — Joseph Miller, Jr.

(74) *Attorney, Agent, or Firm* — Christie, Parker & Hale, LLP

(57) ABSTRACT

A thin film deposition apparatus includes: a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a plurality of patterning slits arranged in the first direction; a position detection member that detects a relative position of the substrate to the patterning slit sheet; and an alignment control member that controls a relative position of the patterning slit sheet to the substrate by using the relative position of the substrate detected by the position detection member, wherein the thin film deposition apparatus and the substrate are separated from each other, and the thin film deposition apparatus and the substrate are moved relative to each other.

19 Claims, 14 Drawing Sheets

(56) References Cited

U.S. PATENT DOCUMENTS 4,792,378 A 12/1988 Rose et al.
4,901,667 A 2/1990 Suzuki et al.
5,454,847 A 10/1995 Jacoboni et al.
5,460,654 A 10/1995 Kikkawa et al.
5,487,609 A 1/1996 Asada
5,742,129 A 4/1998 Nagayama et al.
5,909,995 A 6/1999 Wolf et al.
6,045,671 A * 4/2000 Wu et al. ......................... 506/40
6,091,195 A 7/2000 Forrest et al.
6,099,649 A 8/2000 Schmitt et al.
6,274,198 B1 8/2001 Dautartas
6,280,821 B1 8/2001 Kadunce et al.
6,371,451 B1 4/2002 Choi
6,417,034 B2 7/2002 Kitazume et al.
6,443,597 B1 9/2002 Natori
6,483,690 B1 11/2002 Nakajima et al.
6,541,130 B2 4/2003 Fukuda
6,554,969 B1 4/2003 Chong
6,579,422 B1 6/2003 Kakinuma
6,589,673 B1 7/2003 Kido et al.
6,650,023 B2 11/2003 Kim
6,699,324 B1 3/2004 Berdin et al.
6,749,906 B2 6/2004 Van Slyke
6,776,847 B2 8/2004 Yamazaki et al.
6,837,939 B1 1/2005 Klug et al.
6,878,209 B2 4/2005 Himeshima et al.
6,946,783 B2 9/2005 Kim
6,995,035 B2 2/2006 Cok et al.
7,006,202 B2 2/2006 Byun et al.
RE39,024 E 3/2006 Takahashi
7,078,070 B2 7/2006 Peng
7,199,520 B2 4/2007 Fujii et al.
7,282,855 B2 10/2007 Park et al.
7,322,248 B1 1/2008 Long
7,495,389 B2 2/2009 Noguchi et al.
7,601,439 B2 10/2009 Chun et al.
7,776,457 B2 8/2010 Lee et al.
7,872,256 B2 1/2011 Sung et al.
7,910,386 B2 3/2011 Shiang et al.
7,964,037 B2 6/2011 Fukuda et al.
8,022,448 B1 9/2011 Luu et al.
8,128,753 B2 3/2012 Bulovic et al.
8,137,466 B2 3/2012 Kang et al.
8,188,476 B2 5/2012 Takagi et al.
8,193,011 B2 6/2012 Kang et al.
8,673,077 B2 3/2014 Sonoda et al.
2001/0004186 A1 6/2001 Song et al.
2001/0006827 A1 7/2001 Yamazaki et al.
2001/0019807 A1 9/2001 Yamada et al.
2001/0026638 A1 10/2001 Sangu et al.
2001/0034175 A1 10/2001 Miyazaki et al.
2002/0011785 A1 1/2002 Tang et al.
2002/0017245 A1 2/2002 Tsubaki et al.
2002/0033136 A1 3/2002 Savage et al.
2002/0036759 A1* 3/2002 Ise et al. .......................... 355/53
2002/0050061 A1* 5/2002 Komyoji et al. ................ 29/846
2002/0076847 A1 6/2002 Yamada et al.
2002/0168577 A1 11/2002 Yoon
2002/0179013 A1 12/2002 Kido et al.
2002/0187253 A1 12/2002 Marcus et al.
2002/0194727 A1 12/2002 Cho et al.
2002/0197393 A1 12/2002 Kuwabara
2003/0021886 A1* 1/2003 Baele ................................ 427/8
2003/0101932 A1 6/2003 Kang
2003/0101937 A1 6/2003 Van Slyke et al.
2003/0117602 A1 6/2003 Kobayashi et al.
2003/0118950 A1 6/2003 Chao et al.
2003/0124764 A1 7/2003 Yamazaki et al.
2003/0151637 A1 8/2003 Nakamura et al.
2003/0164934 A1 9/2003 Nishi et al.
2003/0168013 A1 9/2003 Freeman et al.
2003/0173896 A1 9/2003 Grushin et al.
2003/0221614 A1 12/2003 Kang et al.
2003/0221620 A1 12/2003 Yamazaki
2003/0232563 A1 12/2003 Kamiyama et al.
2004/0016907 A1 1/2004 Shi
2004/0029028 A1 2/2004 Shimizu
2004/0056244 A1 3/2004 Marcus et al.
2004/0086639 A1 5/2004 Grantham et al.
2004/0096771 A1 5/2004 Kashiwagi et al.
2004/0115338 A1 6/2004 Yoneda
2004/0115342 A1 6/2004 Shigemura
2004/0123804 A1 7/2004 Yamazaki et al.
2004/0127066 A1 7/2004 Jung
2004/0134428 A1 7/2004 Sasaki et al.
2004/0142108 A1 7/2004 Atobe et al.
2004/0144321 A1 7/2004 Grace et al.
2004/0157167 A1 8/2004 Morii
2004/0183435 A1 9/2004 Ohshita
2004/0194702 A1 10/2004 Sasaki et al.
2004/0195530 A1 10/2004 Kwak et al.
2004/0216673 A1 11/2004 Sakata et al.
2004/0255857 A1 12/2004 Chow et al.
2004/0263547 A1 12/2004 Sugahara
2004/0263771 A1 12/2004 Jeong et al.
2005/0001546 A1 1/2005 Yamaguchi
2005/0016461 A1* 1/2005 Klug et al. .................... 118/726
2005/0031836 A1 2/2005 Hirai
2005/0037136 A1 2/2005 Yamamoto
2005/0039684 A1 2/2005 Yi et al.
2005/0072359 A1 4/2005 Kim
2005/0072361 A1 4/2005 Yang et al.
2005/0079418 A1 4/2005 Kelley et al.
2005/0110400 A1 5/2005 Nakamura
2005/0118788 A1 6/2005 Kuwahara et al.
2005/0129489 A1 6/2005 Quan et al.
2005/0153472 A1 7/2005 Yotsuya
2005/0166842 A1 8/2005 Sakamoto
2005/0166844 A1 8/2005 Gralenski
2005/0183670 A1 8/2005 Grantham et al.
2005/0186330 A1 8/2005 Kim et al.
2005/0213021 A1 9/2005 Myoung
2005/0217584 A1 10/2005 Abiko et al.
2005/0229848 A1 10/2005 Shinriki et al.
2005/0244580 A1 11/2005 Cok et al.
2005/0263074 A1 12/2005 Masuda et al.
2005/0280356 A1* 12/2005 Murayama et al. ........... 313/503
2006/0011136 A1 1/2006 Yamazaki et al.
2006/0012771 A1 1/2006 Jeong
2006/0022590 A1 2/2006 Aziz et al.
2006/0040132 A1 2/2006 Liao et al.
2006/0045958 A1 3/2006 Abiko et al.
2006/0066231 A1 3/2006 Nishikawa et al.
2006/0090705 A1 5/2006 Kim
2006/0102078 A1 5/2006 Fairbairn et al.
2006/0110544 A1 5/2006 Kim et al.
2006/0113907 A1 6/2006 Im et al.
2006/0115585 A1 6/2006 Bulovic et al.
2006/0130766 A1 6/2006 Kim et al.
2006/0144325 A1 7/2006 Jung et al.
2006/0152641 A1 7/2006 Brody
2006/0164786 A1 7/2006 Kobayashi et al.
2006/0169211 A1 8/2006 Kim et al.
2006/0174829 A1 8/2006 An et al.
2006/0205101 A1 9/2006 Lee et al.
2006/0244696 A1 11/2006 Jung et al.
2006/0267294 A1 11/2006 Busse et al.
2006/0269671 A1 11/2006 Kim et al.
2006/0272572 A1 12/2006 Uematsu et al.
2006/0278522 A1 12/2006 Kim et al.
2006/0278945 A1 12/2006 Sakurai
2006/0280588 A1* 12/2006 Blonigan et al. ........... 414/749.1
2007/0009552 A1 1/2007 Whitehead et al.
2007/0009652 A1 1/2007 Manz et al.
2007/0017445 A1 1/2007 Takehara et al.
2007/0022955 A1 2/2007 Bender et al.
2007/0024185 A1 2/2007 Kitamura et al.
2007/0046185 A1 3/2007 Kim
2007/0046913 A1 3/2007 Shibazaki
2007/0054044 A1 3/2007 Shimosaki et al.
2007/0075955 A1 4/2007 Jung et al.
2007/0077358 A1 4/2007 Jeong et al.
2007/0148337 A1 6/2007 Nichols et al.
2007/0148348 A1 6/2007 Huh et al.

(56) References Cited

U.S. PATENT DOCUMENTS

2007/0157879 A1 7/2007 Yotsuya
2007/0158471 A1 7/2007 Park et al.
2007/0163497 A1 7/2007 Grace et al.
2007/0178708 A1 8/2007 Ukigaya
2007/0190235 A1* 8/2007 Yamazaki et al. .............. 427/64
2007/0195844 A1 8/2007 Ma et al.
2007/0231460 A1 10/2007 Ukigaya
2007/0235157 A1* 10/2007 Bunker et al. .................. 164/28
2007/0275497 A1 11/2007 Kwack et al.
2007/0297887 A1 12/2007 Tanaka
2008/0018236 A1 1/2008 Arai et al.
2008/0038935 A1 2/2008 Baude et al.
2008/0057183 A1 3/2008 Spindler et al.
2008/0100204 A1 5/2008 Kim
2008/0115729 A1 5/2008 Oda et al.
2008/0118743 A1 5/2008 Lee et al.
2008/0129194 A1 6/2008 Abe et al.
2008/0131587 A1 6/2008 Boroson et al.
2008/0145521 A1 6/2008 Guo et al.
2008/0174235 A1 7/2008 Kim et al.
2008/0202421 A1* 8/2008 Allen et al. ................... 118/720
2008/0216741 A1 9/2008 Ling et al.
2008/0238294 A1 10/2008 Xu et al.
2008/0251785 A1 10/2008 Noh et al.
2008/0286461 A1 11/2008 Noguchi et al.
2008/0290791 A1 11/2008 Lee et al.
2008/0298947 A1 12/2008 Yeo et al.
2008/0309718 A1 12/2008 Oya et al.
2009/0001882 A1 1/2009 Park et al.
2009/0014412 A1 1/2009 Nozawa et al.
2009/0017192 A1 1/2009 Matsuura
2009/0027767 A1 1/2009 Souriau et al.
2009/0124033 A1 5/2009 Moriyama
2009/0133629 A1 5/2009 Kamikawa et al.
2009/0153033 A1 6/2009 Lee et al.
2009/0165713 A1 7/2009 Kim et al.
2009/0169868 A1 7/2009 Haglund, Jr. et al.
2009/0170230 A1 7/2009 Kidu et al.
2009/0181163 A1 7/2009 Uetake
2009/0208754 A1 8/2009 Chu et al.
2009/0220691 A1 9/2009 Kim
2009/0229524 A1* 9/2009 Kim et al. ..................... 118/726
2009/0232976 A1 9/2009 Yoon et al.
2009/0269881 A1 10/2009 Furuta et al.
2009/0277386 A1 11/2009 Takagi et al.
2009/0279173 A1 11/2009 Chui et al.
2009/0302750 A1 12/2009 Jun et al.
2009/0304906 A1 12/2009 Suduo et al.
2009/0304924 A1 12/2009 Gadgil
2009/0308317 A1 12/2009 Sone et al.
2009/0315456 A1 12/2009 Furukawa et al.
2010/0001301 A1 1/2010 Karg et al.
2010/0055810 A1 3/2010 Sung et al.
2010/0086672 A1 4/2010 Von Drasek et al.
2010/0089443 A1 4/2010 Bloomstein et al.
2010/0090594 A1 4/2010 Choi et al.
2010/0130020 A1 5/2010 Kim et al.
2010/0156279 A1 6/2010 Tamura et al.
2010/0165454 A1* 7/2010 Suetsugu et al. .............. 359/355
2010/0170439 A1 7/2010 Negishi
2010/0192856 A1 8/2010 Sung et al.
2010/0196607 A1 8/2010 Carlson et al.
2010/0248416 A1 9/2010 Priddy et al.
2010/0255198 A1 10/2010 Cleary et al.
2010/0271602 A1 10/2010 Hanazaki
2010/0275842 A1 11/2010 Park et al.
2010/0297348 A1 11/2010 Lee et al.
2010/0297349 A1 11/2010 Lee et al.
2010/0310768 A1 12/2010 Lee et al.
2010/0328197 A1 12/2010 Lee et al.
2010/0330265 A1 12/2010 Lee et al.
2010/0330712 A1 12/2010 Lee et al.
2011/0033619 A1 2/2011 Lee et al.
2011/0033621 A1 2/2011 Lee et al.
2011/0042659 A1 2/2011 Kim et al.
2011/0045617 A1 2/2011 Kang et al.
2011/0048320 A1 3/2011 Choi et al.
2011/0052791 A1 3/2011 Jo et al.
2011/0052795 A1 3/2011 Choi et al.
2011/0053296 A1 3/2011 Lee et al.
2011/0053300 A1 3/2011 Ryu et al.
2011/0068331 A1 3/2011 Koh et al.
2011/0123707 A1 5/2011 Lee et al.
2011/0139069 A1 6/2011 Ahn et al.
2011/0165327 A1 7/2011 Park et al.
2011/0168986 A1 7/2011 Lee et al.
2011/0220019 A1 9/2011 Lee et al.
2011/0220022 A1 9/2011 Hong et al.
2011/0241438 A1 10/2011 Kim et al.
2011/0262625 A1 10/2011 Park et al.
2011/0266944 A1 11/2011 Song et al.
2012/0006259 A1 1/2012 Sung et al.
2012/0009328 A1 1/2012 Ryu et al.
2012/0009332 A1 1/2012 Kim et al.
2012/0009706 A1 1/2012 Choi et al.
2012/0028390 A1 2/2012 Lee et al.
2012/0068199 A1 3/2012 Sung et al.
2012/0068201 A1 3/2012 Sung et al.
2012/0070928 A1 3/2012 Kim et al.
2012/0083061 A1 4/2012 Kang et al.
2012/0097992 A1 4/2012 Jeong
2012/0100282 A1 4/2012 Lee et al.
2012/0103253 A1 5/2012 Park et al.
2012/0132137 A1 5/2012 Oh et al.
2012/0145077 A1 6/2012 Chang et al.
2012/0148743 A1 6/2012 Bulovic et al.
2012/0174865 A1 7/2012 Choi et al.
2012/0175605 A1 7/2012 Shin et al.
2012/0183676 A1 7/2012 Sonoda et al.
2012/0214263 A1 8/2012 Yamazaki et al.
2012/0299016 A1 11/2012 Choi
2012/0299023 A1 11/2012 Lee et al.
2012/0299024 A1 11/2012 Lee et al.
2012/0301614 A1 11/2012 Choi et al.
2012/0301986 A1 11/2012 Choi et al.
2012/0313251 A1 12/2012 Kato
2013/0001528 A1 1/2013 Chang et al.
2013/0008379 A1 1/2013 Chang et al.
2013/0032829 A1 2/2013 Sung et al.
2013/0157016 A1 6/2013 Kim
2013/0217164 A1 8/2013 Kang et al.
2013/0291796 A1 11/2013 Inoue et al.
2013/0298829 A1 11/2013 Jo et al.
2013/0341598 A1 12/2013 Chang et al.
2014/0010957 A1 1/2014 Inoue et al.
2014/0014917 A1 1/2014 Lee et al.
2014/0014918 A1 1/2014 Han
2014/0014920 A1 1/2014 Lee
2014/0014921 A1 1/2014 Choi
2014/0014924 A1 1/2014 Oh et al.
2014/0014929 A1 1/2014 Lee et al.
2014/0034917 A1 2/2014 Lee et al.
2014/0045343 A1 2/2014 Choi et al.
2014/0077168 A1 3/2014 Kim
2014/0084262 A1 3/2014 Kim
2014/0084263 A1 3/2014 Jin et al.
2014/0110680 A1 4/2014 Choe
2014/0131667 A1 5/2014 Chang

FOREIGN PATENT DOCUMENTS

CN 1500904 A 6/2004
CN 1556872 A 12/2004
CN 1607868 A 4/2005
CN 1682569 A 10/2005
CN 1704501 A 12/2005
CN 1814854 A 8/2006
CN 1841696 A 10/2006
EP 1 413 644 4/2004
EP 1 418 250 5/2004
EP 1 518 940 3/2005
EP 2354270 A1 8/2011
JP 57-194252 A2 11/1982
JP 2-247372 10/1990

(56) References Cited

FOREIGN PATENT DOCUMENTS

| | | | |
|---|---|---|---|
| JP | 4-272170 | | 9/1992 |
| JP | 5-22405 | U1 | 3/1993 |
| JP | 5-98425 | A2 | 4/1993 |
| JP | 5-230628 | A2 | 9/1993 |
| JP | 08-027568 | | 1/1996 |
| JP | 9-95776 | A2 | 4/1997 |
| JP | 10-50478 | | 2/1998 |
| JP | 10-120171 | | 5/1998 |
| JP | 10-270535 | | 10/1998 |
| JP | 11-144865 | | 5/1999 |
| JP | 2000-68054 | | 3/2000 |
| JP | 2000-282219 | | 10/2000 |
| JP | 2000-323277 | | 11/2000 |
| JP | 2001-28325 | A2 | 1/2001 |
| JP | 2001-52862 | | 2/2001 |
| JP | 2001-93667 | | 4/2001 |
| JP | 2002-75638 | A2 | 3/2002 |
| JP | 2002-175878 | | 6/2002 |
| JP | 2002-348659 | A2 | 12/2002 |
| JP | 2003-3250 | | 1/2003 |
| JP | 2003-77662 | | 3/2003 |
| JP | 2003-157973 | | 5/2003 |
| JP | 2003-197531 | A2 | 7/2003 |
| JP | 2003-297562 | | 10/2003 |
| JP | 2003-321767 | A2 | 11/2003 |
| JP | 2003-347394 | A2 | 12/2003 |
| JP | 2004-035964 | A2 | 2/2004 |
| JP | 2004-43898 | | 2/2004 |
| JP | 2004-76150 | A2 | 3/2004 |
| JP | 2004-91858 | A2 | 3/2004 |
| JP | 2004-103269 | | 4/2004 |
| JP | 2004-103341 | | 4/2004 |
| JP | 2004-107764 | A2 | 4/2004 |
| JP | 2004-137583 | A2 | 5/2004 |
| JP | 2004-143521 | A2 | 5/2004 |
| JP | 2004-169169 | A2 | 6/2004 |
| JP | 2004-199919 | | 7/2004 |
| JP | 2004-225058 | | 8/2004 |
| JP | 2004-342455 | A2 | 12/2004 |
| JP | 2004-349101 | | 12/2004 |
| JP | 2004-355975 | | 12/2004 |
| JP | 2005-44592 | | 2/2005 |
| JP | 2005-101505 | | 4/2005 |
| JP | 2005-122980 | A2 | 5/2005 |
| JP | 2005-163099 | | 6/2005 |
| JP | 2005-165015 | A2 | 6/2005 |
| JP | 2005-174843 | A2 | 6/2005 |
| JP | 2005-206939 | | 8/2005 |
| JP | 2005-213616 | A2 | 8/2005 |
| JP | 2005-235568 | | 9/2005 |
| JP | 2005-293968 | | 10/2005 |
| JP | 2005-296737 | | 10/2005 |
| JP | 2006-028583 | | 2/2006 |
| JP | 2006-172930 | | 6/2006 |
| JP | 2006-176809 | | 7/2006 |
| JP | 2006-210038 | A2 | 8/2006 |
| JP | 2006-219760 | | 8/2006 |
| JP | 2006-275433 | | 10/2006 |
| JP | 2006-292955 | | 10/2006 |
| JP | 2006-307247 | A2 | 11/2006 |
| JP | 2007-47293 | | 2/2007 |
| JP | 2007-66862 | | 3/2007 |
| JP | 2007-146219 | | 6/2007 |
| JP | 2007-157886 | | 6/2007 |
| JP | 2007-186740 | A2 | 7/2007 |
| JP | 2007-242436 | | 9/2007 |
| JP | 2007-291506 | A2 | 11/2007 |
| JP | 2008-19477 | A2 | 1/2008 |
| JP | 2008-108628 | A2 | 5/2008 |
| JP | 2008-121098 | | 5/2008 |
| JP | 2008-521165 | A2 | 6/2008 |
| JP | 2008-156686 | | 7/2008 |
| JP | 2008-196003 | | 8/2008 |
| JP | 2008-248301 | A2 | 10/2008 |
| JP | 2008-274373 | | 11/2008 |
| JP | 2008-300056 | | 12/2008 |
| JP | 2009-19243 | | 1/2009 |
| JP | 2009-024208 | | 2/2009 |
| JP | 2009-049223 | | 3/2009 |
| JP | 2009-081165 | | 4/2009 |
| JP | 2009-87910 | | 4/2009 |
| JP | 2009-117231 | A2 | 5/2009 |
| JP | 2010-159167 | A2 | 7/2010 |
| JP | 2010-261081 | | 11/2010 |
| JP | 2011-47035 | | 3/2011 |
| JP | WO 2011/034011 | A1 | 3/2011 |
| JP | 2011-146377 | | 7/2011 |
| JP | 2012-92448 | | 5/2012 |
| JP | 2012-211352 | | 11/2012 |
| KR | 1997-0008709 | A | 2/1997 |
| KR | 10-0257219 | | 2/2000 |
| KR | 10-2000-0019254 | | 4/2000 |
| KR | 10-2000-0023929 | | 5/2000 |
| KR | 2001-0024652 | A | 3/2001 |
| KR | 2001-0030175 | A | 4/2001 |
| KR | 10-2001-0039298 | A | 5/2001 |
| KR | 10-2001-0059939 | | 7/2001 |
| KR | 10-2001-0092914 | A | 10/2001 |
| KR | 2001-0093666 | | 10/2001 |
| KR | 20-0257218 | Y1 | 12/2001 |
| KR | 10-2002-0000201 | | 1/2002 |
| KR | 2002-0001555 | A | 1/2002 |
| KR | 2002-0025760 | | 4/2002 |
| KR | 10-2002-0050922 | | 6/2002 |
| KR | 10-2002-0090934 | | 12/2002 |
| KR | 10-2002-0091457 | A | 12/2002 |
| KR | 2003-0001745 | A | 1/2003 |
| KR | 10-2003-0034730 | A | 5/2003 |
| KR | 10-2003-0043012 | A | 6/2003 |
| KR | 2003-0046090 | A | 6/2003 |
| KR | 2003-0069684 | A | 8/2003 |
| KR | 10-0406059 | B1 | 11/2003 |
| KR | 10-2003-0091947 | | 12/2003 |
| KR | 2003-0094033 | A | 12/2003 |
| KR | 10-2004-0014258 | | 2/2004 |
| KR | 20-0342433 | Y1 | 2/2004 |
| KR | 10-2004-0034537 | | 4/2004 |
| KR | 10-2004-0039910 | A | 5/2004 |
| KR | 10-0430336 | B1 | 5/2004 |
| KR | 10-2004-0050045 | | 6/2004 |
| KR | 10-2004-0069281 | | 8/2004 |
| KR | 10-2004-0084747 | | 10/2004 |
| KR | 10-2004-0087142 | | 10/2004 |
| KR | 10-2004-0110718 | A | 12/2004 |
| KR | 10-2005-0018234 | A | 2/2005 |
| KR | 10-2005-0024324 | A | 3/2005 |
| KR | 10-2005-0028943 | | 3/2005 |
| KR | 10-2005-0039140 | A | 4/2005 |
| KR | 10-0483487 | B1 | 4/2005 |
| KR | 10-2005-0062853 | A | 6/2005 |
| KR | 10-2005-0082644 | A | 8/2005 |
| KR | 10-0532657 | B1 | 12/2005 |
| KR | 10-2006-0008602 | | 1/2006 |
| KR | 10-2006-0018745 | | 3/2006 |
| KR | 10-2006-0020050 | A | 3/2006 |
| KR | 10-2006-0045225 | A | 5/2006 |
| KR | 10-2006-0049050 | A | 5/2006 |
| KR | 10-2006-0051746 | A | 5/2006 |
| KR | 10-2006-0053926 | A | 5/2006 |
| KR | 10-2006-0056706 | A | 5/2006 |
| KR | 10-2006-0058459 | A | 5/2006 |
| KR | 10-2006-0059068 | A | 6/2006 |
| KR | 10-2006-0059323 | A | 6/2006 |
| KR | 10-2006-0060994 | | 6/2006 |
| KR | 10-2006-0065978 | A | 6/2006 |
| KR | 10-2006-0073367 | | 6/2006 |
| KR | 10-2006-0077887 | A | 7/2006 |
| KR | 10-2006-0080481 | | 7/2006 |
| KR | 10-2006-0080482 | | 7/2006 |
| KR | 10-2006-0081943 | A | 7/2006 |
| KR | 10-2006-0083510 | | 7/2006 |
| KR | 10-2006-0092387 | A | 8/2006 |
| KR | 10-2006-0098755 | A | 9/2006 |
| KR | 10-2006-0104288 | A | 10/2006 |

(56) References Cited

FOREIGN PATENT DOCUMENTS

KR 10-2006-0104675 10/2006
KR 10-2006-0109561 A 10/2006
KR 10-2006-0109627 10/2006
KR 10-0635903 B1 10/2006
KR 10-2006-0114462 A 11/2006
KR 10-2006-0114477 A 11/2006
KR 10-2006-0114573 A 11/2006
KR 10-0645719 B1 11/2006
KR 10-2006-0213944 12/2006
KR 10-0687007 2/2007
KR 10-2007-0025164 3/2007
KR 10-0696547 3/2007
KR 10-0696550 3/2007
KR 10-0697663 B1 3/2007
KR 10-2007-0035796 4/2007
KR 10-2007-0037848 A 4/2007
KR 10-2007-0050793 5/2007
KR 10-2008-0044239 A 5/2007
KR 10-0723627 5/2007
KR 10-2007-0056190 A 6/2007
KR 10-0736218 B1 7/2007
KR 10-0739309 B1 7/2007
KR 10-0741142 B1 7/2007
KR 10-2007-0080635 8/2007
KR 10-2007-0091437 A 9/2007
KR 10-2006-0028115 10/2007
KR 10-2007-0097218 10/2007
KR 10-2007-0098122 A 10/2007
KR 10-2007-0105595 10/2007
KR 10-0768212 B1 10/2007
KR 10-0770653 10/2007
KR 10-2007-0112668 A 11/2007
KR 10-2007-0114094 A 11/2007
KR 10-0787457 B1 12/2007
KR 10-2008-0001184 1/2008
KR 10-2008-0003720 1/2008
KR 10-2008-0007896 A 1/2008
KR 10-2008-0009285 A 1/2008
KR 10-0800125 1/2008
KR 10-2008-0036983 4/2008
KR 10-0823508 4/2008
KR 10-0823508 B1 4/2008
KR 10-0823511 B1 4/2008
KR 10-2008-0044775 5/2008
KR 10-2008-0046761 A 5/2008
KR 10-2008-0048653 6/2008
KR 10-2008-0055124 A 6/2008
KR 10-2008-0057159 A 6/2008
KR 10-2008-0060400 7/2008
KR 10-2008-0061132 7/2008
KR 10-2008-0061666 A 7/2008
KR 10-2008-0061774 7/2008
KR 10-2008-0062212 7/2008
KR 10-2008-0076574 A 8/2008
KR 10-2008-0088737 A 10/2008
KR 10-2008-0104479 A 12/2008
KR 10-2008-0104695 A 12/2008
KR 10-2008-0109559 A 12/2008
KR 10-2009-0017910 A 2/2009
KR 10-0889872 B1 3/2009
KR 10-2009-0038733 4/2009
KR 10-2009-0040618 A 4/2009
KR 10-2009-0047953 A 5/2009
KR 10-2009-0052155 A 5/2009
KR 10-2009-0052828 A 5/2009
KR 10-2009-0053417 A 5/2009
KR 10-0899279 B1 5/2009
KR 10-2009-0066996 A 6/2009
KR 10-2009-0079765 A 7/2009
KR 10-2009-0081717 A 7/2009
KR 10-0908232 B1 7/2009
KR 10-2009-0093161 A 9/2009
KR 10-2009-0094911 A 9/2009
KR 10-2009-0107702 10/2009
KR 10-0922763 A 10/2009
KR 10-2009-0075887 A 11/2009
KR 10-2010-0000128 A 1/2010
KR 10-2010-0000129 A 1/2010
KR 10-2010-0002381 A 1/2010
KR 10-2010-0026655 A 3/2010
KR 10-2010-0038088 A 4/2010
KR 10-2010-0044606 A 4/2010
KR 10-2010-0047796 5/2010
KR 10-0961110 B1 6/2010
KR 10-2010-0090070 A 8/2010
KR 10-2010-0099806 9/2010
KR 10-2010-0119368 A 11/2010
KR 10-2010-0126125 12/2010
KR 10-2010-0128589 A 12/2010
KR 10-2010-0130786 A 12/2010
KR 10-2010-0133678 A 12/2010
KR 10-2010-0138139 A 12/2010
KR 10-1017654 B1 2/2011
KR 10-2011-0021090 A 3/2011
KR 10-2011-0022512 A 3/2011
KR 10-2011-0032589 A 3/2011
KR 10-2011-0082418 A 7/2011
KR 10-2011-0101767 A 9/2011
KR 10-2011-0110525 A 10/2011
KR 10-2011-0120213 A 11/2011
KR 10-2011-0138787 A 12/2011
KR 10-2012-0006322 A 1/2012
KR 10-2012-0006324 1/2012
KR 10-2012-0012300 2/2012
KR 10-2012-0042155 A 5/2012
KR 10-2012-0065789 A 6/2012
KR 10-2012-0080855 A 7/2012
KR 10-2012-0081811 A 7/2012
KR 10-1193186 B1 10/2012
KR 10-2012-0131545 A 12/2012
KR 10-2013-0007308 A 1/2013
WO 9925894 A1 5/1999
WO 03043067 A1 5/2003
WO WO2004016406 A1 2/2004
WO 2008004792 A1 1/2008

OTHER PUBLICATIONS

KIPO Office action dated Feb. 1, 2012, for Korean Patent application 10-2010-0014272, 4 pages.

English-language abstract of Korean Publication No. KR 10-2002-0034272.

English-language abstract of Korean Publication No. KR 10-2002-0056238.

English-language abstract of Korean Publication No. KR 10-2002-0088662.

English-language abstract of Korean Publication No. KR 10-2005-0045619.

English-language abstract of Korean Publication No. KR 10-2006-0126267.

English-language abstract of Korean Publication No. KR 10-2008-0038650.

KIPO Registration Determination Certificate dated Aug. 24, 2012, for Korean Patent application 10-2010-0066993, (5 pages).

KIPO Office action dated Aug. 1, 2011, for Korean Patent application 10-2009-0074001, 3 pages.

Patent Abstracts of Japan, and English machine translation of Japanese Publication 2009-024208, listed above, 30 pages.

KIPO Office action dated Apr. 2, 2012, for Korean Patent application 10-2010-0066993, (4 pages).

JPO Office action dated Jul. 22, 2014, for corresponding Japanese Patent application 2011-054148, (2 pages).

European Search Report dated May 13, 2011 for European Application No. 11250019.4 (6 pages).

European Search Report dated May 20, 2011 for European Application No. 10251404.9 (12 pages).

European Search Report dated May 27, 2011 for European Application No. 10251514.5 (11 pages).

European Search Report dated Sep. 6, 2010 for European Application No. 10250962.7 (5 pages).

(56) References Cited

OTHER PUBLICATIONS

Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office action dated Jan. 13, 2012, issued to KR 10-2009-0056529 (5 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).

(56) References Cited

OTHER PUBLICATIONS

U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office action dated May 6, 2014, issued to U.S. Appl. No. 13/467,998 (21 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20pages).
US Office action dated Sep. 12, 2012, in U.S. Appl. No. 12/815,673 (26 pages).

* cited by examiner

THIN FILM DEPOSITION APPARATUS

CROSS-REFERENCE TO RELATED APPLICATION

This application claims the benefit of Korean Patent Application No. 10-2010-0021835, filed on Mar. 11, 2010, in the Korean Intellectual Property Office, the disclosure of which is incorporated herein in its entirety by reference.

BACKGROUND OF THE INVENTION

1. Field of the Invention

Aspects of the present invention relate to a thin film deposition apparatus, and more particularly to a thin film deposition apparatus that can be simply applied to produce large-sized display devices on a mass scale and that improves manufacturing yield.

2. Description of the Related Art

Organic light-emitting display devices have a larger viewing angle, better contrast characteristics, and a faster response rate than other display devices, and thus have drawn attention as a next-generation display device.

An organic light-emitting display device includes intermediate layers, including an emission layer disposed between a first electrode and a second electrode that are arranged opposite to each other. The electrodes and the intermediate layers may be formed via various methods, one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

However, the deposition method using such an FMM presents difficulties in manufacturing larger devices using a mother glass having a size of 5G or greater. For example, when such a large mask is used, the mask may bend due to self-gravity, thereby distorting a pattern. Such disadvantages are not conducive for the recent trend towards high-definition patterns.

SUMMARY OF THE INVENTION

In order to address the drawback of the deposition method using a fine metal mask (FMM) and/or other issues, aspects of the present invention provide a thin film deposition apparatus that may be simply applied to produce large-sized display devices on a mass scale and that may be suitable for high-definition patterning.

According to an aspect of the present invention, there is provided a thin film deposition apparatus to form a thin film on a substrate, the apparatus comprising: a deposition source that discharges a deposition material; a deposition source nozzle unit disposed at a side of the deposition source and including a plurality of deposition source nozzles arranged in a first direction; a patterning slit sheet disposed opposite to and spaced apart from the deposition source nozzle unit and including a plurality of patterning slits arranged in the first direction; a barrier plate assembly comprising a plurality of barrier plates that are disposed between the deposition source nozzle unit and the patterning slit sheet in the first direction, and that partition a space between the deposition source nozzle unit and the patterning slit sheet into a plurality of sub-deposition spaces; a position detection member that detects a relative position of the substrate to the patterning slit sheet; and an alignment control member that controls a relative position of the patterning slit sheet to the substrate by using the relative position of the substrate detected by the position detection member, wherein the thin film deposition apparatus and the substrate are spaced apart from each other, and the thin film deposition apparatus or the substrate is moved relative to each other.

According to non-limiting aspect, the patterning slit sheet may include a first alignment mark, the substrate may include a second alignment mark, and the position detection member may further include a camera that takes images of the first alignment mark and the second alignment mark.

According to non-limiting aspect, the second alignment mark may include at least one stripe that is substantially parallel to a direction in which the substrate is moved.

According to non-limiting aspect, the thin film deposition apparatus may further include a focus control member disposed between the camera and the patterning slit sheet to control a focal point of the camera.

According to non-limiting aspect, the focus control member may be disposed to be rotatable, and may include a first hole and a second hole that have different refractive indices.

According to non-limiting aspect, one of the first hole and the second hole may be filled with a transparent material.

According to non-limiting aspect, the focus control member may be disposed in such a way that the first hole and the second hole alternate on an optical axis of the camera.

According to non-limiting aspect, the camera may take the images while reciprocating along an optical axis of the camera.

According to non-limiting aspect, the position detection member may further include: a laser irradiation member that irradiates a laser beam in a direction substantially parallel to a direction in which the substrate is moved; and at least one measurement member coaxially disposed with the laser beam irradiated from the laser irradiation member and comprising a third alignment mark.

According to non-limiting aspect, the alignment control member may include at least two first actuators providing a predetermined driving force to move the patterning slit sheet or the substrate in the first direction.

According to non-limiting aspect, the alignment control member may include at least three second actuators providing a predetermined driving force to move the patterning slit sheet or the substrate in a direction perpendicular to a deposition surface of the substrate.

According to non-limiting aspect, the patterning slit sheet may be smaller than the substrate.

According to non-limiting aspect, the plurality of barrier plates may extend in a second direction substantially perpendicular to the first direction.

According to non-limiting aspect, the plurality of barrier plates may be arranged at equal intervals.

According to non-limiting aspect, the barrier plate assembly may include a first barrier plate assembly including a plurality of first barrier plates, and a second barrier plate assembly including a plurality of second barrier plates.

According to non-limiting aspect, each of the first barrier plates and each of the second barrier plates may extend in a second direction substantially perpendicular to the first direction.

According to non-limiting aspect, the first barrier plates may be arranged to respectively correspond to the second barrier plates.

According to non-limiting aspect, each pair of the corresponding first and second barrier plates may be arranged on substantially the same plane.

According to an aspect of the present invention, there is provided a thin film deposition apparatus for forming a thin film on a substrate, the apparatus comprising: a deposition source that discharges a deposition material; a deposition source nozzle unit disposed at a side of the deposition source and including a plurality of deposition source nozzles arranged in a first direction; a patterning slit sheet disposed opposite to and spaced apart from the deposition source nozzle unit and including a plurality of patterning slits arranged in a second direction perpendicular to the first direction; a position detection member that detects a relative position of the substrate to the patterning slit sheet; and an alignment control member that controls a relative position of the patterning slit sheet to the substrate by using the relative position of the substrate detected by the position detection member, wherein a deposition is performed while the substrate or the thin film deposition apparatus is moved relative to each other in the first direction, and the deposition source, the deposition source nozzle unit, and the patterning slit sheet are integrally formed as one body.

According to non-limiting aspect, the patterning slit sheet may include a first alignment mark, the substrate may include a second alignment mark, and the position detection member may further include a camera that takes images of the first alignment mark and the second alignment mark.

According to non-limiting aspect, the second alignment mark may include at least one stripe that is substantially parallel to a direction in which the substrate is moved.

According to non-limiting aspect, the thin film deposition apparatus may further include a focus control member disposed between the camera and the patterning slit sheet to control a focal point of the camera.

According to non-limiting aspect, the focus control member may be disposed to be rotatable, and may include a first hole and a second hole that have different refractive indices.

According to non-limiting aspect, one of the first hole and the second hole may be filled with a transparent material.

According to non-limiting aspect, the focus control member may be disposed in such a way that the first hole and the second hole alternate on an optical axis of the camera.

According to non-limiting aspect, the camera may take the images while reciprocating along an optical axis of the camera.

According to non-limiting aspect, the position detection member may further include: a laser irradiation member that irradiates a laser beam in a direction substantially parallel to a direction in which the substrate is moved; and at least one measurement member coaxially disposed with the laser beam irradiated from the laser irradiation member and comprising a third alignment mark.

According to non-limiting aspect, the alignment control member may include at least two first actuators providing a predetermined driving force to move the patterning slit sheet or the substrate in the first direction.

According to non-limiting aspect, the alignment control member may include at least three second actuators providing a predetermined driving force to move the patterning slit sheet or the substrate in a direction perpendicular to a deposition surface of the substrate.

According to non-limiting aspect, the deposition source and the deposition source nozzle unit, and the patterning slit sheet may be integrally connected as one body by a connection member.

According to non-limiting aspect, the connection member may guide a flow path of the deposition material.

According to non-limiting aspect, the connection member may seal a space between the deposition source nozzle unit disposed at the side of the deposition source, and the patterning slit sheet.

According to non-limiting aspect, the thin film deposition apparatus may be separated from the substrate by a predetermined distance.

According to non-limiting aspect, the deposition material discharged from the thin film deposition apparatus may be continuously deposited on the substrate while the substrate or the thin film deposition apparatus is moved relative to each other in the first direction.

According to non-limiting aspect, the patterning slit sheet of the thin film deposition apparatus may be smaller than the substrate.

According to non-limiting aspect, the plurality of deposition source nozzles may be tilted at a predetermined angle.

The plurality of deposition source nozzles may include deposition source nozzles arranged in two rows formed in the first direction, and the deposition source nozzles in the two rows may be tilted to face each other.

According to non-limiting aspect, the plurality of deposition source nozzles may include deposition source nozzles arranged in two rows formed in the first direction, wherein the deposition source nozzles of a row located at a first side of the patterning slit sheet may be arranged to face a second side of the patterning slit sheet, and the deposition source nozzles of the other row located at the second side of the patterning slit sheet may be arranged to face the first side of the patterning slit sheet.

According to a another embodiment of the present invention, there is provided a thin film deposition apparatus to form a thin film on a substrate, the apparatus including at least one thin film deposition assembly including a deposition source that discharges a deposition material through a plurality of deposition source nozzles; a patterning slit sheet disposed opposite to and spaced apart from the deposition source nozzles and spaced apart from the substrate and including a plurality of patterning slits through which the deposition material passes to be deposited on the substrate; a conveyor unit that conveys the substrate relative to the patterning slit sheet from a starting position, in which the deposition material that passes through the patterning slits is deposited on a leading portion of the substrate, through a middle position, in which the deposition material that passes through the patterning slits is deposited on a middle portion of the substrate, to a finishing position, in which the deposition material that passes through the patterning slits is deposited on a trailing portion of the substrate; a position detection system that detects an orientation of the substrate and a relative position of the substrate with respect to the patterning slit sheet; and an alignment control system that corrects errors in the orientation and relative position of the patterning slit sheet with respect the substrate based on the orientation and relative position of the substrate detected by the position detection member.

Additional aspects and/or advantages of the invention will be set forth in part in the description which follows and, in part, will be obvious from the description, or may be learned by practice of the invention.

BRIEF DESCRIPTION OF THE DRAWINGS

The above and other features and advantages of aspects of the present invention will become more apparent by describing in detail exemplary embodiments thereof with reference to the attached drawings in which.

DETAILED DESCRIPTION OF THE EMBODIMENTS

Figure 1:
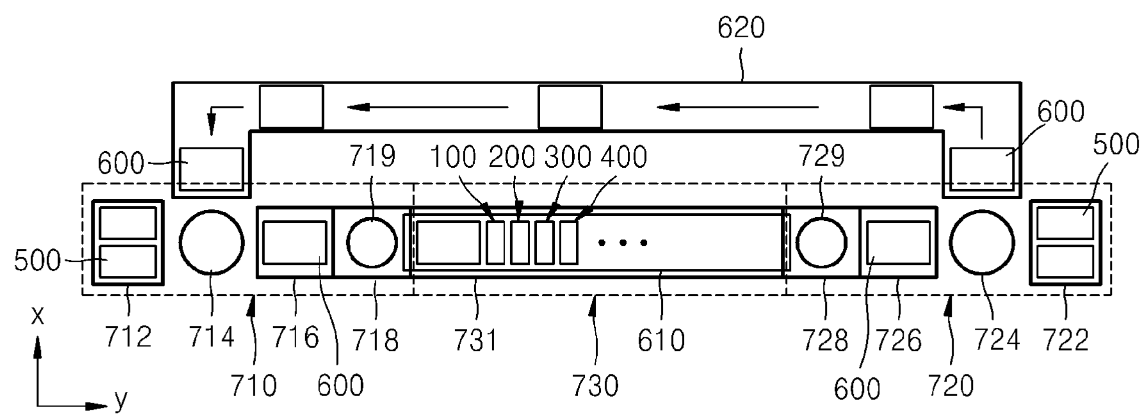
FIG. 1 is a schematic view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures.

Figure 2:
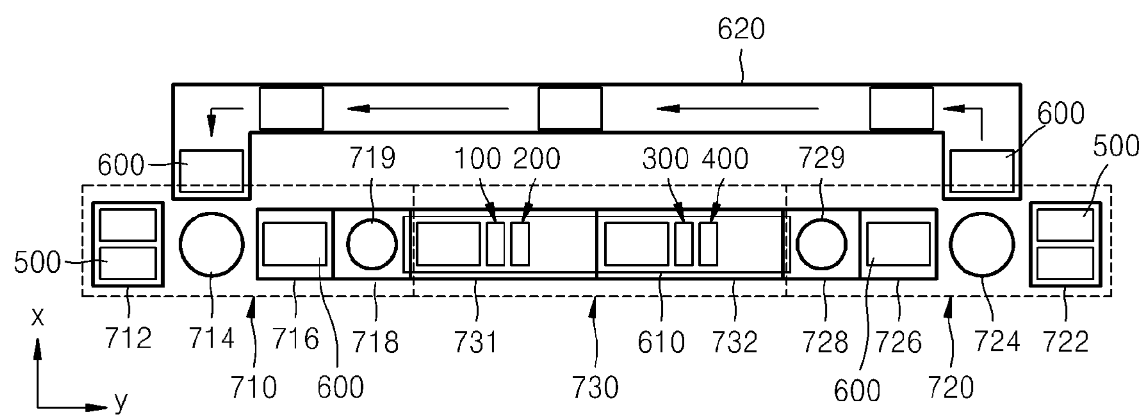
FIG. 2 illustrates a modified example of the thin film deposition apparatus of FIG. 1.
Figure 3:
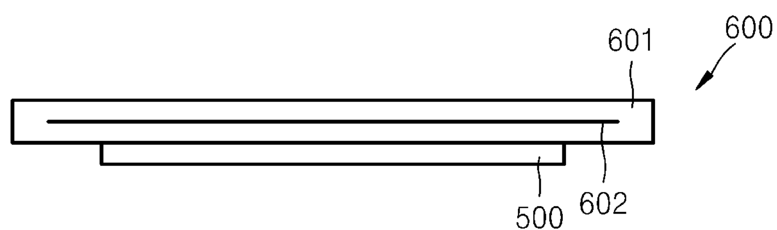
FIG. 3 is a cross-sectional view of an example of an electrostatic chuck of FIG. 1.

FIG. 1 is a schematic perspective view of a thin film deposition apparatus according to another embodiment of the present invention. FIG. 2 illustrates a modified example of the thin film deposition apparatus of FIG. 1. FIG. 3 is a view of an example of an electrostatic chuck 600.

Referring to FIG. 1, the thin film deposition apparatus according to the current embodiment includes a loading unit 710, a deposition unit 730, an unloading unit 720, a first conveyer unit 610 and a second conveyer unit 620.

The loading unit 710 may include a first rack 712, a transport robot 714, a transport chamber 716, and a first inversion chamber 718.

A plurality of substrates 500 onto which a deposition material has not yet been applied are stacked up on the first rack 712. The transport robot 714 picks up one of the substrates 500 from the first rack 712, disposes it on the electrostatic chuck 600 transferred by the second conveyor unit 620, and moves the electrostatic chuck 600 on which the substrate 500 is disposed into the transport chamber 716.

The first inversion chamber 718 is disposed adjacent to the transport chamber 716. The first inversion chamber 718 includes a first inversion robot 719 that inverts the electrostatic chuck 600 and then loads it into the first conveyer unit 610 of the deposition unit 730.

Referring to FIG. 3, the electrostatic chuck 600 may include an electrode 602 embedded in a main body 601 formed of ceramic, wherein the electrode 602 is supplied with power. The electrostatic chuck 600 may fix the substrate 500 on a surface of the main body 601 when a high voltage is applied to the electrode 602.

Referring to FIG. 1, the transport robot 714 places one of the substrates 500 on the surface of the electrostatic chuck 600 and transfers the electrostatic chuck 600 on which the substrate 500 is disposed into the transport chamber 716. The first inversion robot 719 inverts the electrostatic chuck 600 so that the substrate 500 is turned upside down in the deposition unit 730. In other words, in FIGS. 1 and 2, the first inversion robot 719 inverts the electrostatic chuck 600 from an orientation in which the substrate 500 is on an opposite side of the electrostatic chuck 600 from the thin film deposition assemblies 100, 200, 300, 400 (and in which the substrate faces a viewer of FIGS. 1 and 2) to an orientation in which the substrate 500 faces the thin film deposition assemblies 100, 200, 300, 400.

The unloading unit 720 is constituted to operate in an opposite manner to the loading unit 710 described above. Specifically, a second inversion robot 729 in a second inversion chamber 728 inverts the electrostatic chuck 600, which has passed through the deposition unit 730 while the substrate 500 is disposed on the electrostatic chuck 600, and then moves the electrostatic chuck 600 on which the substrate 500 is disposed into an ejection chamber 726. Then, an ejection robot 724 removes the electrostatic chuck 600 on which the substrate 500 is disposed from the ejection chamber 726, separates the substrate 500 from the electrostatic chuck 600, and then loads the substrate 500 into the second rack 722. The electrostatic chuck 600, separated from the substrate 500, is returned back into the loading unit 710 via the second conveyer unit 620.

However, the present invention is not limited to the above description. For example, when disposing the substrate 500 on the electrostatic chuck 600, the substrate 500 may be fixed onto a bottom surface of the electrostatic chuck 600 (that is, a surface of the electrostatic chuck 600 that faces away from a viewer of FIGS. 1 and 2 and faces the thin film deposition assemblies 100, 200, 300, 400) and then moved into the deposition unit 730. In this case, for example, the first inversion chamber 718 and the first inversion robot 719, and the second inversion chamber 728 and the second inversion robot 729 are not required.

The deposition unit 730 may include at least one deposition chamber. As illustrated in FIG. 1, the deposition unit 730 may include a first chamber 731. In this case, first to four thin film deposition assemblies 100, 200, 300, and 400 may be disposed in the first chamber 731. Although FIG. 1 illustrates that a total of four thin film deposition assemblies, i.e., the first to fourth thin film deposition assemblies 100 to 400, are installed in the first chamber 731, the total number of thin film deposition assemblies that may be installed in the first chamber 731 may vary according to a desired deposition material and deposition conditions. The first chamber 731 is maintained in a vacuum state during a deposition process. In the schematic system configuration diagrams of FIGS. 1 and 2, the thin deposition assemblies 100, 200, 300 and 400 are positioned such that deposition material from the thin deposition assemblies travels in a direction towards the viewer and is deposited on a substrate 500 on a surface of the electrostatic chuck 600 facing the facing the thin deposition assemblies 100, 200, 300 and 400, but it is to be understood that other configurations are possible.

In the thin film deposition apparatus illustrated in FIG. 2, a deposition unit 730 may include a first chamber 731 and a second chamber 732 that are connected to each other. In this case, first and second thin film deposition assemblies 100 and 200 may be disposed in the first chamber 731, and third and fourth thin film deposition assemblies 300 and 400 may be disposed in the second chamber 732. It is to be understood that the number of chambers and the number of thin film deposition assemblies may vary from what is shown in FIGS. 1 and 2.

In the embodiment illustrated in FIG. 1, the electrostatic chuck 600 on which the substrate 500 is disposed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 4:
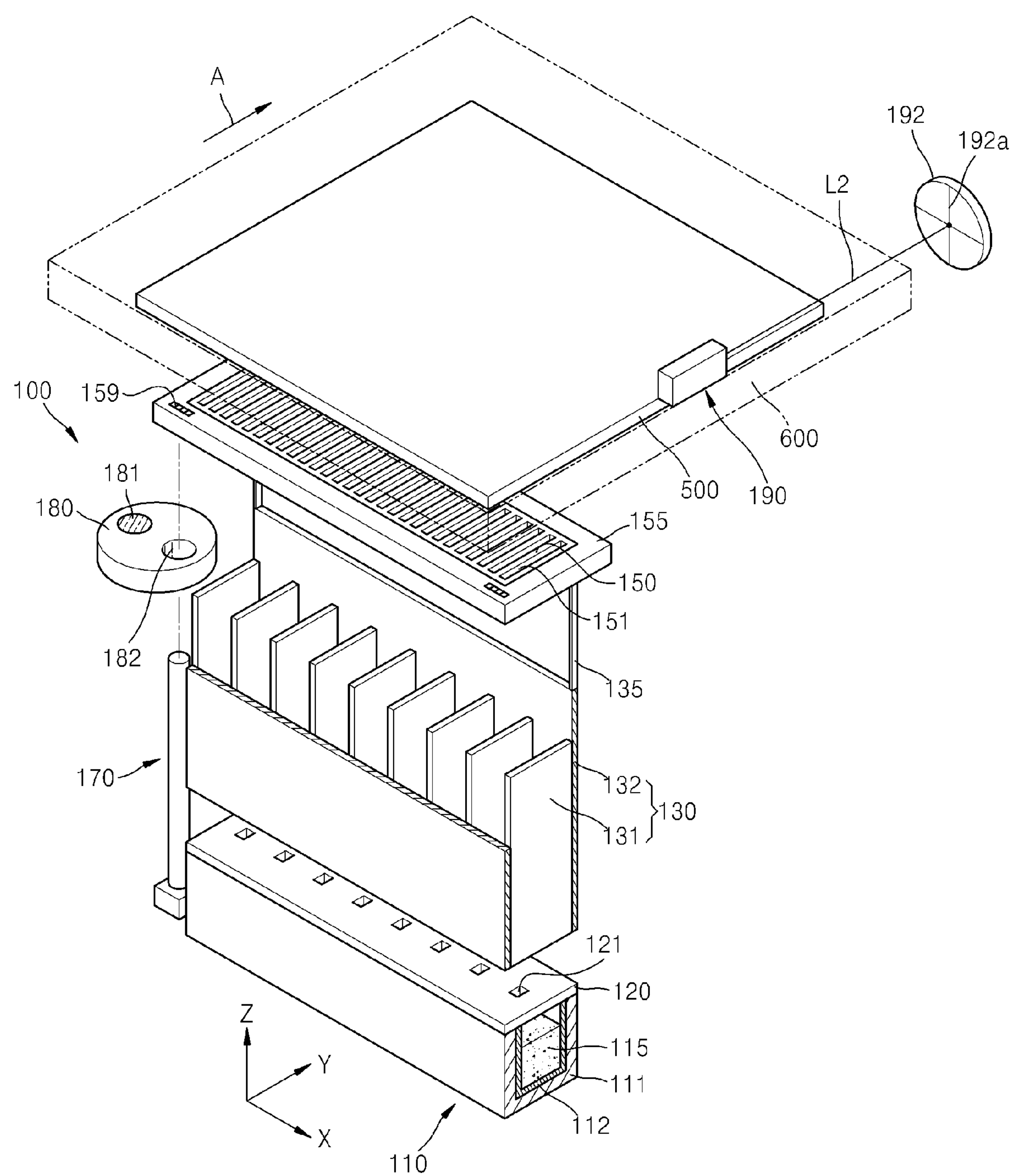
FIG. 4 is a schematic perspective view of a thin film deposition assembly of the thin film deposition apparatus of FIG. 1, according to an embodiment of the present invention.

Hereinafter, an embodiment of the thin film deposition assembly 100 of the thin film deposition mentioned above will be described in more detail. FIG. 4 is a schematic perspective view of the thin film deposition assembly 100 of the thin film deposition apparatus of FIG. 1, FIG. 5 is a cross-sectional side view of the thin film deposition assembly 100 illustrated in FIG. 4, and FIG. 6 is a cross-sectional plan view of the thin film deposition assembly 100 illustrated in FIG. 4.

Figure 5:
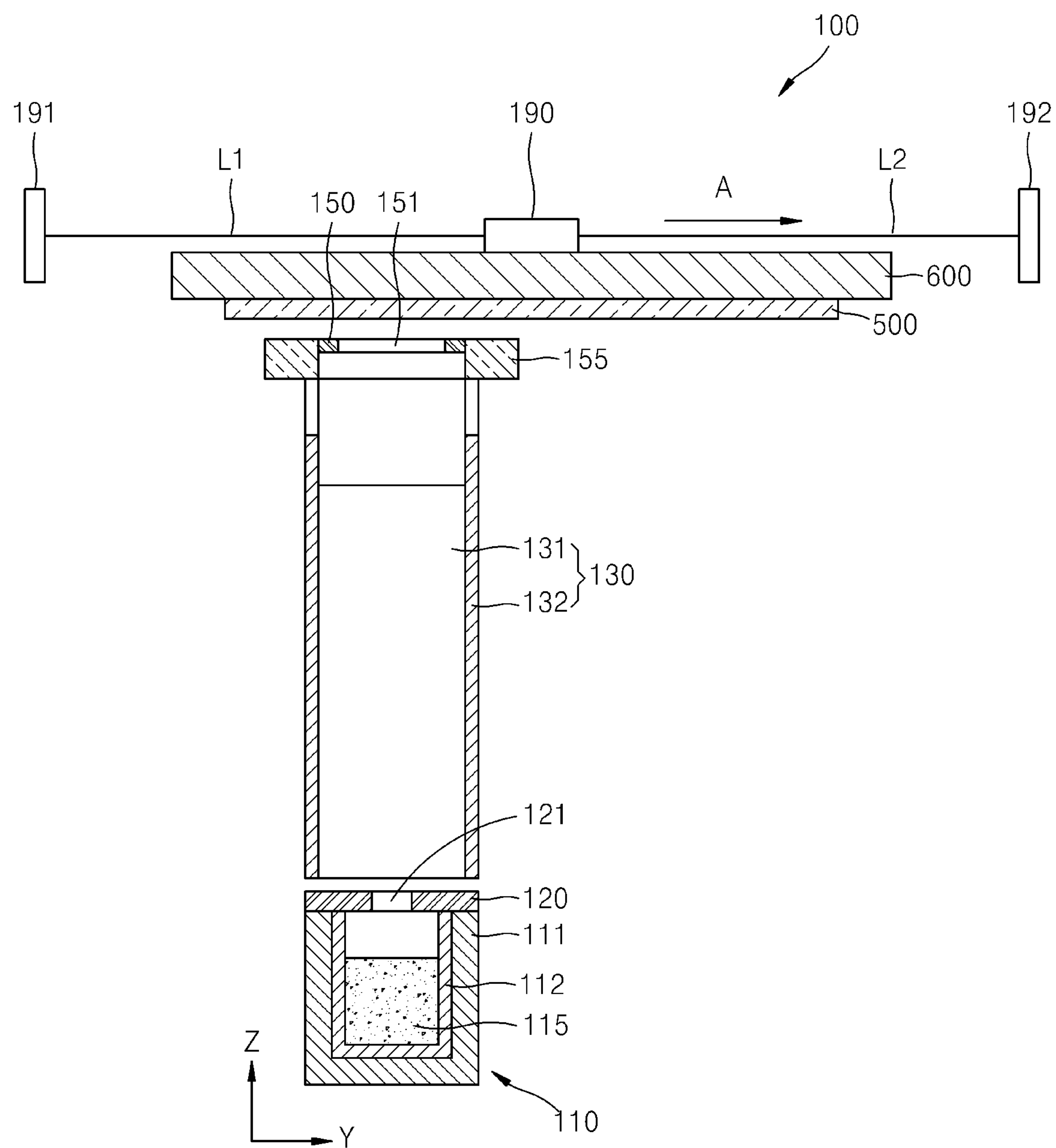
FIG. 5 is a schematic sectional side view of the thin film deposition assembly of FIG. 4, according to an embodiment of the present invention.
Figure 6:
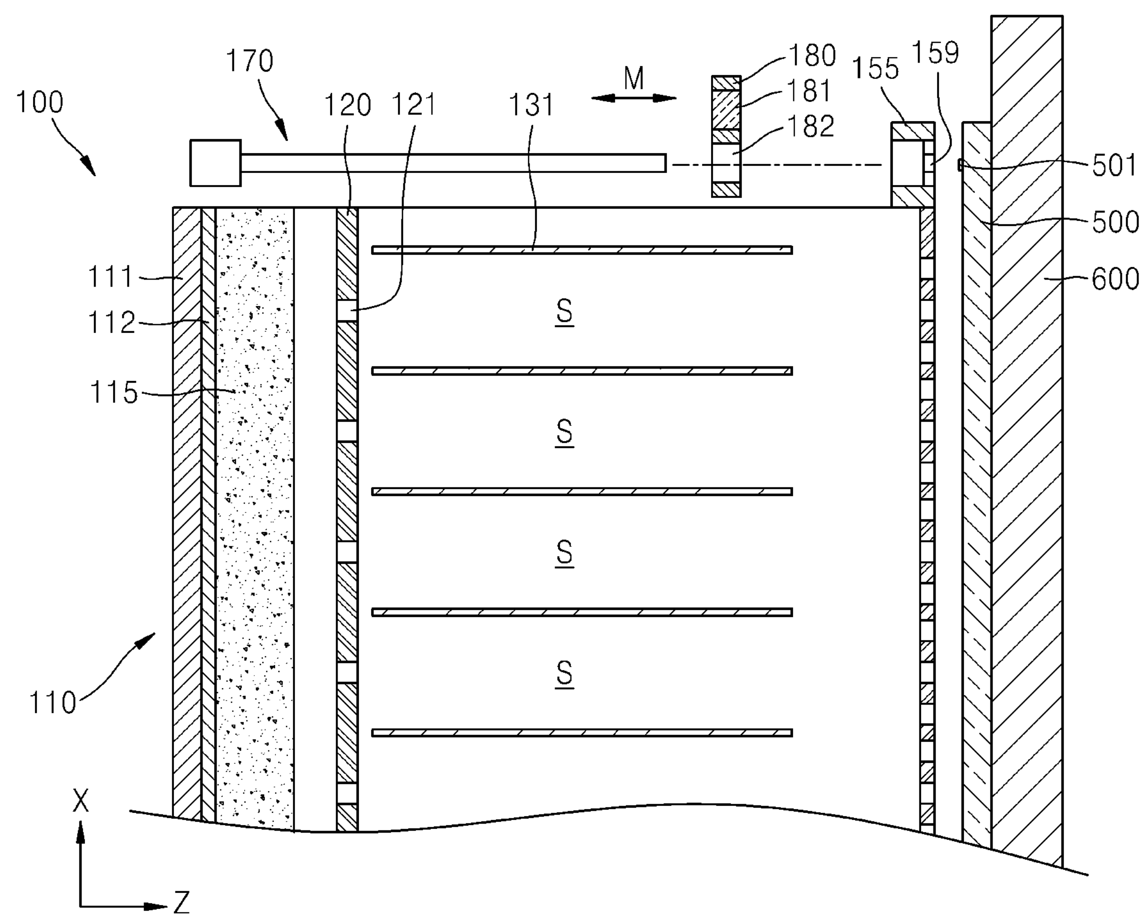
FIG. 6 is a schematic plan view of the thin film deposition assembly of FIG. 4, according to an embodiment of the present invention.

Referring to FIGS. 4, 5 and 6, the thin film deposition assembly 100 according to the current embodiment of the present invention includes a deposition source 110, a deposition source nozzle unit 120, a barrier plate assembly 130 including barrier plates 131, and patterning slit sheet 150 including patterning slits 151. The thin film deposition assembly 100 may further include a position detection member including a camera 170, a focus control member 180, a laser irradiation member 190, and an alignment control member including an actuator (see FIGS. 12 and 13). The position detection member and the alignment control member will be described later in detail.

Although a chamber is not illustrated in FIGS. 4 through 6 for convenience of explanation, all the components of the thin film deposition apparatus 100 may be disposed within a chamber that is maintained at an appropriate degree of vacuum, such as, for example, the first vacuum chamber 731 or the second vacuum chamber 732. The chamber is maintained at an appropriate vacuum in order to allow a deposition material to move in a substantially straight line through the thin film deposition apparatus 100.

In the thin film deposition apparatus, in order to deposit a deposition material 115 that has been discharged from the deposition source 110 and passed through the deposition source nozzle unit 120 and the patterning slits 151, onto the substrate 500 in a desired pattern, it is desirable to maintain the chamber (not shown) in a high-vacuum state. In addition, the temperature of the barrier wall assembly 130 and patterning slit sheet 150 should be sufficiently lower than the temperature of the deposition source 110 to maintain a space between the deposition source nozzle unit 110 and the patterning slit sheet 150 in a high-vacuum state. In this regard, the temperatures of the barrier wall assembly 130 and the patterning slit sheet 150 may be about 100° C. or less, because the deposition material 115 that has collided against the barrier plate assembly 130 does not become vaporized again when the temperature of the barrier plate assembly 130 and the patterning slit sheet 150 is sufficiently low. In addition, thermal expansion of the patterning slit sheet 150 may be minimized when the temperature of the patterning slit sheet 150 is sufficiently low. The barrier plate assembly 130 faces the deposition source 110, which is at a high temperature. In addition, the temperature of a portion of the barrier plate assembly 130 close to the deposition source 110 may rise by a maximum of about 167° C., and thus a partial-cooling apparatus (not shown) may be further included if needed.

In the first chamber 731 of FIG. 1, in which the thin film deposition assembly 100 is disposed, the substrate 500, which constitutes a deposition target on which the deposition material 115 is to be deposited, is transferred by the electrostatic chuck 600. The substrate 500 may be a substrate for flat panel displays. A large substrate, such as a mother glass, for manufacturing a plurality of flat panel displays, may be used as the substrate 500. Other substrates may also be employed.

In an embodiment, the substrate 500 or the thin film deposition assembly 100 may be moved relative to each other. Herein, where it is stated that the substrate and thin film deposition assembly are moved relative to each other, it is to be understood that such statement encompasses an embodiment in which only the substrate is moved and the thin film deposition assembly remains stationary, an embodiment in which only the thin film deposition assembly is moved and the substrate remains stationary and an embodiment in which both the thin film deposition assembly and the substrate are moved. For example, as illustrated in FIG. 4, the substrate 500 may be moved in a direction of an arrow A, relative to the thin film deposition assembly 100.

In a conventional deposition method using a fine metal mask (FMM), the size of the FMM is typically greater than or equal to the size of a substrate. Thus, the size of the FMM has to be increased when deposition is performed on a larger substrate. However, it is difficult to manufacture a large FMM and to extend an FMM to be accurately aligned with a pattern.

In order to overcome this problem, in the thin film deposition assembly 100 according to the current embodiment of the present invention, deposition may be performed while the thin film deposition assembly 100 and the substrate 500 are moved relative to each other. In other words, deposition may be continuously performed while the substrate 500, which is disposed such as to face the thin film deposition assembly 100, is moved in a Y-axis direction. That is, deposition is performed in a scanning manner while the substrate 500 is moved in a direction of arrow A in FIG. 4. Although the substrate 500 is illustrated as being moved in the Y-axis direction in FIG. 3 when deposition is performed, the present invention is not limited thereto. Deposition may be performed while the thin film deposition assembly 100 is moved in the Y-axis direction, while the substrate 500 is held in a fixed position. For example, the transporting of the electrostatic chuck 600 having the substrate 500 fixed thereon by the first conveyor unit 610 may be paused while deposition is performed.

Thus, in the thin film deposition assembly 100 according to the current embodiment of the present invention, the patterning slit sheet 150 may be significantly smaller than an FMM used in a conventional deposition method. In other words, in the thin film deposition assembly 100, deposition is continuously performed, i.e., in a scanning manner while the substrate 500 is moved in the Y-axis direction. Thus, a length of the patterning slit sheet 150 in the Y-axis direction may be significantly less than a length of the substrate 500 in the Y-axis direction. A width of the patterning slit sheet 150 in the X-axis direction and a width of the substrate 500 in the X-axis direction may be substantially equal to each other. However, even when the width of the patterning slit sheet 150 in the X-axis direction is less than the width of the substrate 500 in the X-axis direction, deposition may be performed on the entire substrate 500 in a scanning manner while the substrate 500 and the thin film deposition assembly 100 are moved relative each other.

As described above, since the patterning slit sheet 150 may be formed to be significantly smaller than an FMM used in a conventional deposition method, it is relatively easy to manufacture the patterning slit sheet 150 used in aspects of the present invention. In other words, using the patterning slit sheet 150, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for manufacturing a relatively large display device.

In order to perform deposition while the thin film deposition assembly 100 and the substrate 500 are moved relative to each other as described above, the thin film deposition assembly 100 and the substrate 500 may be spaced apart from each other by a predetermined distance. This will be described later in detail.

The deposition source 110 that contains and heats the deposition material 115 is disposed in an opposite side of the first chamber to a side in which the substrate 500 is disposed.

The deposition source 110 includes a crucible 112 that is filled with the deposition material 115, and a cooling block 111 surrounding the crucible 112. The cooling block 111 prevents radiation of heat from the crucible 112 into outside areas such as, for example, the first chamber. The cooling block 111 may include a heater (not shown) that heats the crucible 111.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 arranged at equal intervals in the X-axis direction. The deposition material 115 that is vaporized in the deposition source 110 passes through the deposition source nozzles 121 of the deposition source nozzle unit 120 towards the substrate 500, which constitutes a target on which the deposition material 115 is to be deposited.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to an YZ plane in FIG. 4, and may have a rectangular shape. The plurality of barrier plates 131 arranged as described above partition the space between the deposition source nozzle unit 120 and the patterning slit sheet 150 into a plurality of sub-deposition spaces S (see FIG. 6). In the thin film deposition assembly 100 according to the current embodiment of the present invention, as illustrated in FIG. 6, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. However, the present invention is not limited to this structure. For example, a plurality of deposition source nozzles 121 may be disposed between two adjacent barrier plates 131. In this case, the deposition source nozzles 121 may be also respectively located at the midpoint between two adjacent barrier plates 131.

As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles slits 121, and passes through the patterning slits 151 so as to be deposited on the substrate 500. In other words, the barrier plates 131 guide the deposition material 115, which is discharged through the deposition source nozzles slits 121, to move in a straight manner and not to scatter in the X-axis direction.

As described above, the deposition material 115 is forced to move in a straight manner by the presence of the barrier plates 131, so that a smaller shadow zone may be formed on the substrate 500 compared to a case where no barrier plates are installed. Thus, the thin film deposition assembly 100 and the substrate 400 can be separated from each other by a predetermined distance. This will be described later in detail.

The barrier plate frame 132, which forms sides of the barrier plates 131, maintains the positions of the barrier plates 131, and guides the deposition material 115, which is discharged through the deposition source nozzles 121, not to flow beyond the boundaries of the barrier plate assembly 130 in the Y-axis direction.

The deposition source nozzle unit 120 and the barrier plate assembly 130 may be separated from each other by a predetermined distance. This separation may prevent the heat radiated from the deposition source unit 110 from being conducted to the barrier plate assembly 130. However, the present invention is not limited to this. For example, an appropriate heat insulator (not shown) may be further disposed between the deposition source nozzle unit 120 and the barrier plate assembly 130. In this case, the deposition source nozzle unit 120 and the barrier plate assembly 130 may be bound together with the heat insulator therebetween.

In addition, the barrier plate assembly 130 may be constructed to be detachable from the thin film deposition assembly 100. In the thin film deposition assembly 100 of the thin film deposition apparatus according to the current embodiment of the present invention, the deposition space is enclosed by using the barrier plate assembly 130, so that the deposition material 115 that is not deposited on the substrate 500 is mostly deposited within the barrier plate assembly 130. Thus, since the barrier plate assembly 130 is constructed to be detachable from the thin film deposition assembly 100, when a large amount of the deposition material 115 is present on the barrier plate assembly 130 after a long deposition process, the barrier plate assembly 130 may be detached from the thin film deposition assembly 100 and then placed in a separate deposition material recycling apparatus in order to recover the deposition material 115. Due to the structure of the thin film deposition assembly 100 according to the present embodiment, a reuse rate of the deposition material 115 is increased, so that the deposition efficiency is improved, and thus, the manufacturing costs are reduced.

The patterning slit sheet 150 and a frame 155 in which the patterning slit sheet 150 is bound are disposed between the deposition source 110 and the substrate 500. The frame 155 may be formed in a lattice shape, similar to a window frame. The patterning slit sheet 150 is bound inside the frame 155. The patterning slit sheet 150 includes a plurality of patterning slits 151 arranged in the X-axis direction. The patterning slits 151 extend as openings in the Y-axis direction. The deposition material 115 that has been vaporized in the deposition source 110 and that has passed through the deposition source nozzle 121 passes through the patterning slits 151 towards the substrate 500.

The patterning slit sheet 150 may be formed of a metal thin film. The patterning slit sheet 150 is fixed to the frame 150 such that a tensile force is exerted thereon. The patterning slits 151 may be formed by etching the patterning slit sheet 150 into a stripe pattern.

In the thin film deposition assembly 100 according to the current embodiment of the present invention, the total number of patterning slits 151 may be greater than the total number of deposition source nozzles 121. In addition, there may be a greater number of patterning slits 151 than deposition source nozzles 121 disposed between two adjacent barrier plates 131. The number of patterning slits 151 may be equal to the number of deposition patterns to be formed on the substrate 500.

In addition, the barrier plate assembly 130 and the patterning slit sheet 150 may be disposed to be spaced apart from each other by a predetermined distance. Alternatively, the barrier plate assembly 130 and the patterning slit sheet 150 may be connected by a connection member 135. The temperature of the barrier plate assembly 130 may increase to 100° C. or higher due to exposure to the deposition source 110, which has a high temperature. Thus, in order to prevent the heat of the barrier plate assembly 130 from being conducted to the patterning slit sheet 150, the barrier plate assembly 130 and the patterning slit sheet 150 may be spaced apart from each other by a predetermined distance.

As described above, the thin film deposition assembly 100 according to the current embodiment of the present invention performs deposition while being moved relative to the substrate 500. In order for the thin film deposition assembly 100 to be moved relative to the substrate 500, the patterning slit sheet 150 is spaced apart from the substrate 500 by a predetermined distance. In addition, in order to prevent the formation of a relatively large shadow zone on the substrate 500 when the patterning slit sheet 150 and the substrate 400 are separated from each other, the barrier plates 131 are arranged between the deposition source nozzle unit 120 and the patterning slit sheet 150 to force the deposition material 115 to move in a straight direction. Thus, the size of the shadow zone that may be formed on the substrate 500 is sharply reduced.

In a conventional deposition method using an FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition assembly 100 according to the current embodiment of the present invention, the patterning slit sheet 150 is disposed to be separated from the substrate 500 by a predetermined distance. Shadow zones on the substrate 500 are minimized by the presence of the barrier plates 131.

As described above, when the patterning slit sheet 150 is manufactured to be smaller than the substrate 500, the patterning slit sheet 150 may be moved relative to the substrate 500 during deposition. Thus, it is no longer necessary to manufacture a large FMM as used in the conventional deposition method. In addition, since the substrate 500 and the patterning slit sheet 150 are separated from each other, defects caused due to contact between the substrate 500 and the patterning slit sheet 150 may be prevented. In addition, since it is unnecessary to contact the substrate 500 with the patterning slit sheet 150 during a deposition process, the manufacturing speed may be improved.

According to aspects of the present invention, thin film deposition assemblies 200, 300 and 400 may have the same structure as the thin film deposition assembly 100 described above. Moreover, It is to be understood that the thin film deposition assemblies 100, 200, 300 and 400 may vary from what is described above.

Hereinafter, an interval control member and an alignment control member, which may be used to obtain sufficient alignment precision and interval precision between the patterning slit sheet 150 and the substrate 500 in the thin film deposition assembly 100 according to the current embodiment of the present invention will be described in detail.

As described above, in the thin film deposition assembly 100 according to the current embodiment of the present invention, the patterning slit sheet 150 is separated from the substrate 500 by a predetermined distance in the Z-axis direction, and deposition is performed while the patterning slit sheet 150 is moved relative to the substrate 500 in the Y-axis direction. However, in order to form a precise thin film pattern while moving the patterning slit sheet 150, positional precision between the patterning slit sheet 150 and the substrate 500 is very significant. In addition, a pattern position may be shifted if the distance between the patterning slit sheet 150 and the substrate 500 varies. Thus, the distance between the patterning slit sheet 150 and the substrate 500 should be maintained as constant as possible, for example, at 100 μm. To this end, the thin film deposition assembly 100 may include a position detection member and an alignment control member. Thus, positions of the patterning slit sheet 150 and the substrate 500 may be accurately detected, and thus be aligned with each other.

The thin film deposition assembly 100, which includes, as illustrated in FIGS. 4 through 6, the camera 170 and the focus control member 180, accurately detects the distance between the thin film deposition assembly 100 and the substrate 500 by using the camera 170 and the focus control member 180.

In particular, the camera 170 detects in real-time a first alignment mark 159 formed on the frame 155 and a second alignment mark 501 (see FIG. 7) formed on a rear surface of the substrate 500. As used herein, the terms "rear surface of the substrate 500" and 'rear surface of the patterned slit sheet 150 refer to a surface of the substrate 500 or patterned slit sheet that faces the thin film deposition assembly 100. The camera 170 is mounted in such a way that its optical path to the frame 155 or the substrate 500 is not obstructed during deposition.

Figure 7:
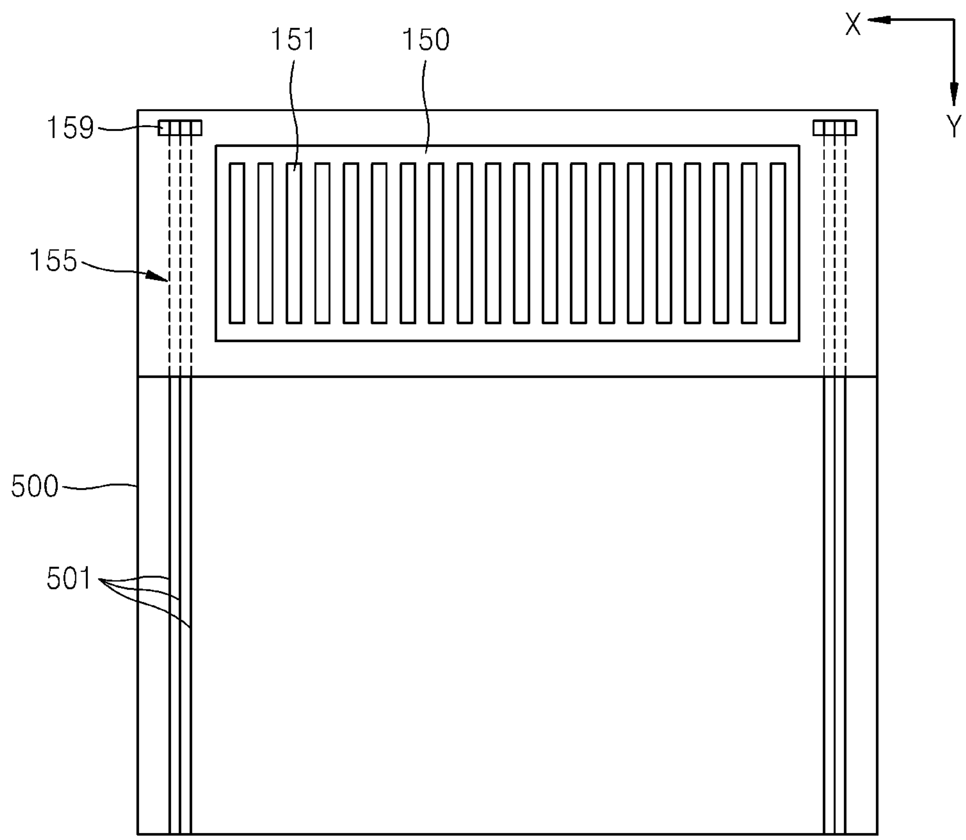
FIG. 7 illustrates a rear surface of a substrate, a real surface of a patterning slit sheet of the thin film deposition assembly of FIG. 4, and an alignment mark on the rear surface of the substrate.

FIG. 7 illustrates rear surfaces of the substrate 500 and the patterning slit sheet 150, and the second alignment mark 501 on the rear surface of the substrate 500. Referring to FIG. 7, the second alignment mark 501 is provided as a plurality of stripes extending along edges of the rear surface of the substrate 500. The second alignment mark 501 is formed parallel to a direction in which the substrate 500 is moved, i.e., a direction Y of FIG. 7, and aligned with the first alignment mark 159 of the frame 155. In other words, the camera 170 detects the second alignment mark 501 of the substrate 500 through the first alignment mark 159 formed on the frame 155.

The reason for implementing the second alignment mark 501 as stripes is as follows. In general thin film deposition apparatuses, a circle, a cross, a rectangular and the like have been used as alignment marks. These marks may be used to effectively align a fixed substrate. However, these marks are not suitable for aligning a moving substrate, as used according to aspects of the present invention, since images of the patterns obtained by the camera 170 do not remain consistent for use in alignment when the substrate moves. Thus, according to aspects of the present invention, a simple stripe pattern is used as an alignment mark, so that consistent images of the pattern may be obtained by the camera 170 while the substrate 500 with the pattern is moved, thereby implementing real-time alignment between the moving substrate 500 and the patterning slit sheet 150.

In addition, according to aspects of the present invention, since the substrate 500 and the patterning slit sheet 150 are separated from each other by a predetermined distance, the distance to the substrate 500 and to the patterning slit sheet 150 may be measured using one camera 170, as follows.

Figure 8:
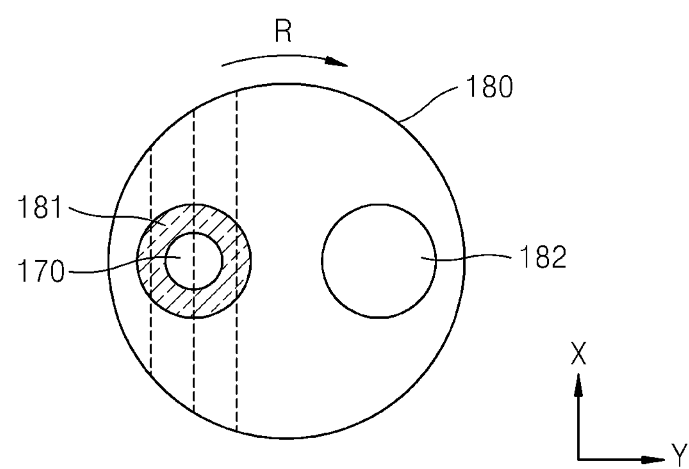
FIGS. 8 and 9 illustrate positional relations among a focus control member and a camera of the thin film deposition assembly of FIG. 4, and the substrate.
Figure 9:
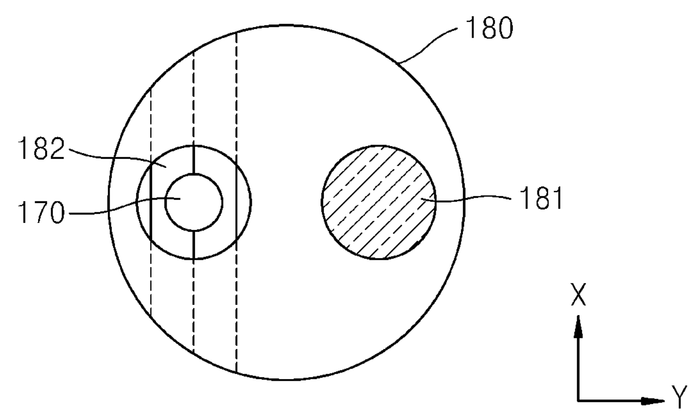

Initially, the focus control member 180 is disposed between the camera 170 and the substrate 500 (see FIGS. 4, 8 and 9). The focus control member 180 is formed in a substantially flat, circular shape and has a first hole 181 and a second hole 182. The first hole 181 remains unfilled, and the second hole 182 is filled with a transparent material, such as glass. Regions of the focus control member 180 in which the first hole 181 and the second hole 182 are respectively formed have different refractive indices. The focus control member 180 is disposed to be rotatable in a direction R of FIG. 8.

Thus, since the focus control member 180 rotates, the camera 170 may have a different focal distance according to whether the first hole 181 or the second hole 182 of the focus control member 180 is positioned to overlap the camera 170. The difference in focal distance is attributed to the fact that air that fills the void of the first hole 181 and the transparent material, such as glass, that fills the second hole have different refractive indices.

For example, as illustrated in FIG. 8, when the first hole 181 is located to be aligned with the camera 170, a focal point of the camera 170 may be on the substrate 500, so that the distance between the camera 170 and the substrate 500 may be measured. On the other hand, as illustrated in FIG. 9, when the second hole 182 is located to be aligned with the camera 170, the focal point of the camera 170 may be on the patterning slit sheet 150, so that the distance between the camera 170 and the patterning slit sheet 150 may be measured.

Alternatively, although not illustrated, the camera 170 may take an image while moving along its optical axis. In other words, the camera 170 may take an image while moving in the directions indicated by the arrow M in FIG. 6. In this case, when the camera 170 moves close to the substrate 500, the focal point of the camera 170 may be on the substrate 500, so that the distance between the camera 170 and the substrate 500 may be measured. On the other hand, when the camera 170 is moved away from the substrate 500, the focal point of the camera 170 may be on the patterning slit sheet 150, so that the distance between the camera 170 and the patterning slit sheet 150 may be measured.

As described above, as the focus control member 180 rotates, the distance between the camera 170 and the substrate 500, and the distance between the camera 170 and the patterning slit sheet 150 may be alternately measured. Thus, the distance between the patterning slit sheet 150 and the substrate 500 may be measured in real-time based on these distances.

Figure 10:
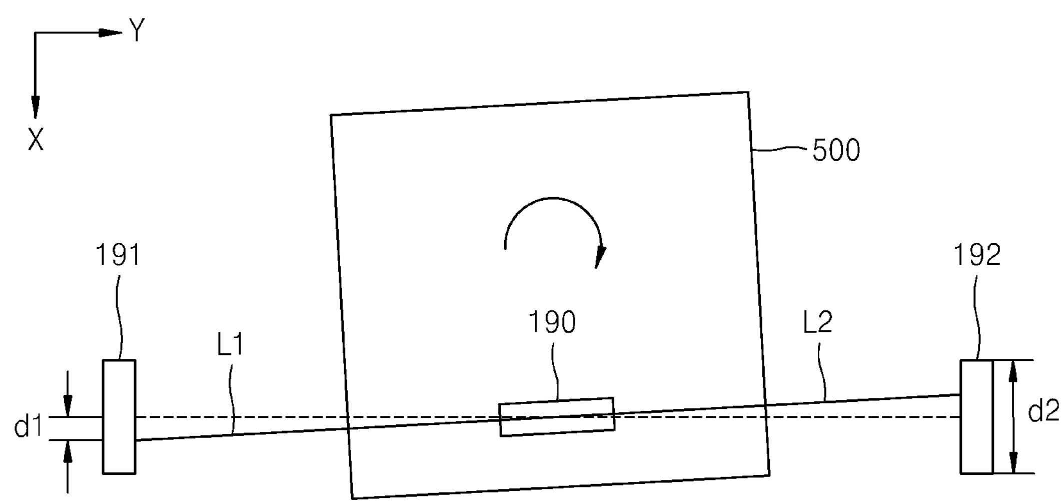
FIG. 10 illustrates a positional relation among a laser irradiation member and measurement members of the thin film deposition assembly of FIG. 4, and the substrate.

In addition, in order to measure a tilt angle of a deposition surface of the substrate 500 with respect to an XY plane, as illustrated in FIGS. 4 and 10, the thin film deposition assembly 100 may further include the laser irradiation member 190 that is disposed on the substrate 500 or on the electrostatic chuck 600. A first measurement member 191 and a second measurement member 192 may be further disposed in the chamber (not shown). The first measurement member 191 and the second measurement member 192 may be coaxially disposed with the laser irradiation member 190. Each of the first measurement member 191 and the second measurement member 192 may have a third alignment mark in a cross shape. For example, reference numeral 192*a* in FIG. 4 denotes the third alignment mark of the second measurement member 192. While the substrate 500 is moved in a direction of arrow A in FIG. 4, the laser irradiation member 190 irradiates laser beams L1 and L2 toward the first measurement member 191 and the second measurement member 192, respectively, and the first measurement member 191 and the second measurement member 192 detect the laser beams L1 and L2, respectively. Detection positions of the laser beams L1 and L2 on the respective third alignment marks 192*a* of the first and second measurement members 191 and 192 are used to measure the tilt angle of the substrate 500 with respect to the XY plane. For example, the tilt angle of the substrate 500 with respect to the XY plane may be measured using a distance d1 between a center of the third alignment mark (not shown) of the first measurement 191 and the detection position of the laser beam L1 on the third alignment mark, and a distance d2 between a center of the third alignment mark 192*a* (see FIG. 4) of the second measurement member 192 and the detection position of the laser beam L2 on the second measurement member 192, as illustrated in FIG. 10.

Although two measurement members, i.e., the first measurement member 191 and the second measurement member 192, are illustrated in FIG. 10, the present invention is not limited to this structure. For example, at least one measurement member may be disposed according to system requirements. However, at the beginning stage of deposition, the substrate 500 is moved by a short distance and may be too close to the first measurement unit 191, so that the distance measured by the first measurement unit 191 may be less accurate. At the end stage of deposition, the substrate 500 may become too close to the second measurement member 192, so that the distance measured by the second measurement unit 192 may be less accurate. Thus, at least one measurement member may be additionally disposed each of at entrance and exit sides of the chamber to improve reliability of the measurement throughout the entire chamber.

Figure 11:
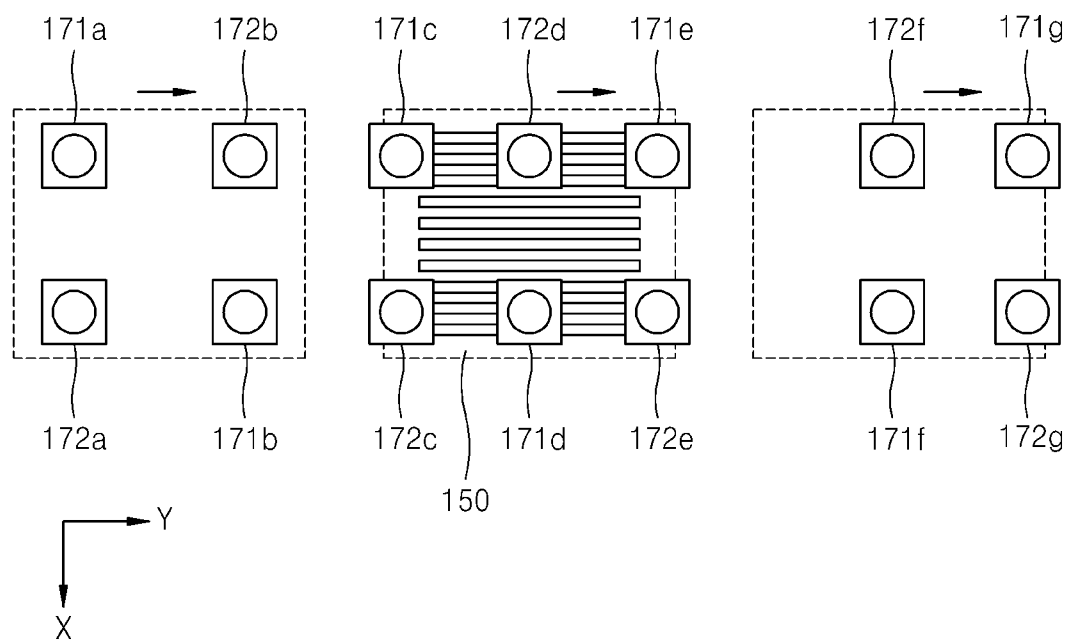
FIG. 11 illustrates an exemplary arrangement of cameras for real-time alignment between a substrate and the thin film deposition assembly in the thin film deposition apparatus of FIG. 1.

A plurality of cameras may be provided to assist in the alignment of the patterning slit sheet 150 of the thin film deposition assembly 100 and the substrate 500. FIG. 11 illustrates an exemplary arrangement of cameras for real-time alignment of the thin film deposition assembly 100 and the substrate 500.

In order to align the thin film deposition assembly 100 and the substrate 500 in real-time, as illustrated in FIG. 11, at least seven horizontal-alignment (parallel to XY-plane in this instance) cameras 171*a*, 171*b*, 171*c*, 171*d*, 171*e*, 171*f*, and 171*g*, and at least seven vertical-alignment (perpendicular to XY-plane in this instance) cameras 172*a*, 172*b*, 172*c*, 172*d*, 172*e*, 172*f* and 172*g* may be used for the following reasons.

In order to accurately measure an instantaneous horizontal position of the substrate 500, three horizontal-alignment cameras are desirable, because a plane can be defined by at least three points. For the same reason, three vertical-alignment cameras are desirable in order to accurately measure an instantaneous vertical position of the substrate 500. Thus, a total of six cameras, including three horizontal-alignment cameras and three vertical-alignment cameras, are desirable in order to accurately measure an instantaneous position of the substrate 500 in three dimensions.

In particular, the three horizontal-alignment cameras 171*a*, 171*b* and 171*c* and the three vertical-alignment cameras 172*a*, 172*b* and 172*c* may be used to accurately measure an instantaneous 3-dimensional position of the substrate 500 when a leading edge portion of the substrate 500 starts to pass the thin film deposition assembly 100. The three horizontal-alignment cameras 171*c*, 171*d* and 171*e* and the three vertical-alignment cameras 172*c*, 172*d* and 172*e* may be used to accurately measure an instantaneous 3-dimensional position of the substrate 500 when the substrate 500 is aligned with the thin film deposition assembly 100 in the middle of the chamber. In addition, the three horizontal-alignment cameras 171*e*, 171*f* and 171*g* and the three vertical-alignment cameras 172*e*, 172*f* and 172*g* may be used to accurately measure an instantaneous 3-dimensional portion of the substrate when a tailing edge portion of the substrate 500 passes the thin film deposition assembly 100.

In particular, the horizontal-alignment camera 171*c* and the vertical-alignment camera 172*c* that are disposed to overlap a front edge portion of the patterning slit sheet 150 of the thin film deposition assembly 100 may be used to take an image of the substrate 500 both when the leading edge portion of the substrate 500 starts to pass the thin film deposition assembly 100 and when the substrate 500 aligns with the thin film deposition assembly 100 in the middle of the chamber. In addition, the horizontal-alignment camera 171*e* and the vertical-alignment camera 172*e* that are disposed to overlap a rear edge portion of the patterning slit sheet 150 of the thin film deposition assembly 100 may be used to take an image of the substrate 500 both when the substrate 500 aligns with the thin film deposition assembly 100 and when the tailing edge portion of the substrate 500 completely passes by the thin film deposition assembly 100.

Due to the structure described above, the substrate 500 may be aligned with the thin film deposition apparatus 100 using a minimum number of cameras, so that the manufacturing costs may be reduced, and a deposition apparatus may have a simplified structure.

Figure 12:
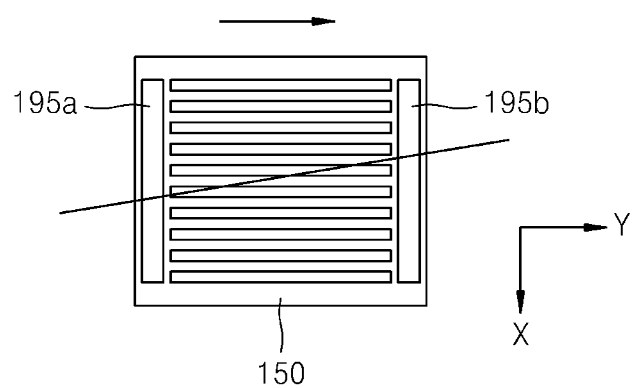
FIGS. 12 and 13 illustrate exemplary arrangements of actuators for real-time alignment of the substrate and the thin film deposition assembly in the thin film deposition apparatus of FIG. 1.
Figure 13:
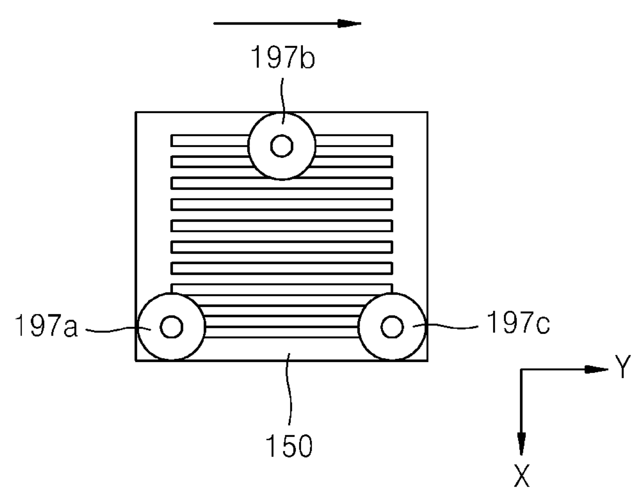

FIGS. 12 and 13 illustrate exemplary arrangements of actuators for real-time alignment of the substrate 500 and the thin film deposition assembly in the thin film deposition apparatus of FIG. 1. Referring to FIG. 12, at least two first actuators 195*a* and 195*b* may be used to correct tilting of the patterning slit sheet 150 in a direction (i.e., the X-axis direction) perpendicular to the Y-axis direction in which in which the substrate 500 is moved. In addition, referring to FIG. 13, at least three second actuators 197*a*, 197*b* and 197*c* may be used to correct tilting of the patterning slit sheet 150 in a direction (i.e., the Z-axis direction of FIG. 4) perpendicular to the deposition surface of the substrate 500. Since the substrate 500 may be precisely transferred using a linear motion (LM) system that includes a LM rail and a LM block, tilting of the patterning slit sheet 150 in the direction in which the substrate 500 is moved, i.e., in the Y-axis direction, is typically not necessary.

In particular, the two first actuators 195*a* and 195*b* may be driven in the same direction to move the patterning slit sheet 150 in the X-axis direction. The first actuators 195*a* and 195*b* may be driven in opposite directions to rotate the patterning slit sheet 150 on an XY plane parallel to the deposition surface of the substrate 500.

In addition, the three second actuators 197*a*, 197*b* and 197*c* may be driven in the same direction to move the patterning slit sheet 150 in the Z-axis direction (see FIG. 4). In addition, the second actuators 197*a*, 197*b* and 197*c* may be driven in different directions to rotate the patterning slit sheet 150 around a central axis thereof parallel to the X-axis direction or the Y-axis direction.

Due to the structure described above, tilting of the substrate 500 may be corrected using a minimum number of actuators.

Figure 20:
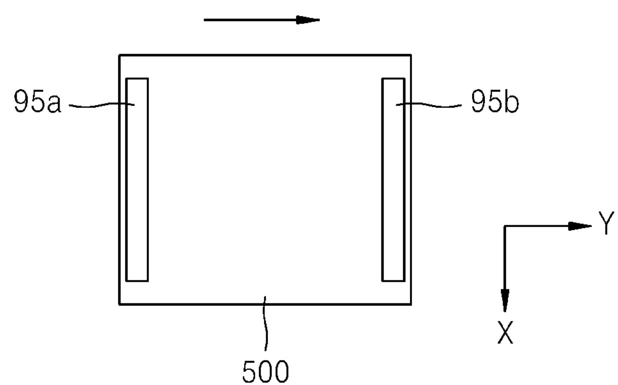
FIGS. 20 and 21 illustrate additional exemplary arrangements of actuators for real-time alignment of the substrate and the thin film deposition assembly in the thin film deposition apparatus of FIG. 1.
Figure 21:
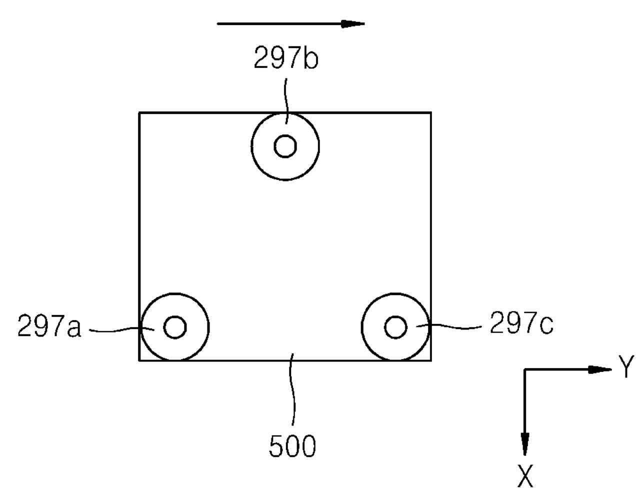

In the above description, it is to be understood that in addition or in the alternative, actuators similar to the first actuators 195*a* and 195*b* and the second actuators 197*a*, 197*b* and 197*c* may be disposed to correct the alignment of the substrate 500 and the thin film deposition apparatus 100 by moving the substrate 500. In more detail, FIGS. 20 and 21 illustrate exemplary arrangements of actuators for real-time alignment of the substrate 500 and the thin film deposition assembly in the thin film deposition apparatus of FIG. 1. Referring to FIG. 20, at least two first actuators 295*a* and 295*b* may be used to correct tilting of the substrate 500 in a direction (i.e., the X-axis direction) perpendicular to the Y-axis direction in which in which the substrate 500 is moved. In addition, referring to FIG. 21, at least three second actuators 297*a*, 297*b* and 297*c* may be used to correct tilting of the substrate 500 in a direction (i.e., the Z-axis direction of FIG. 4) perpendicular to the deposition surface of the substrate 500. Since the substrate 500 may be precisely transferred using a linear motion (LM) system that includes a LM rail and a LM block, tilting of the substrate 500 in the direction in which the substrate 500 is moved, i.e., in the Y-axis direction, is typically not necessary.

In particular, the two first actuators 295*a* and 295*b* may be driven in the same direction to move the substrate 500 in the X-axis direction. The first actuators 295*a* and 295*b* may be driven in opposite directions to rotate the substrate 500 on an XY plane parallel to the deposition surface of the substrate 500.

In addition, the three second actuators 297*a*, 297*b* and 297*c* may be driven in the same direction to move the substrate 500 in the Z-axis direction (see FIG. 4). In addition, the second actuators 297*a*, 297*b* and 297*c* may be driven in different directions to rotate the substrate 500 around a central axis thereof parallel to the X-axis direction or the Y-axis direction.

Due to the structure described above, tilting of the substrate 500 may be corrected using a minimum number of actuators.

Figure 14:
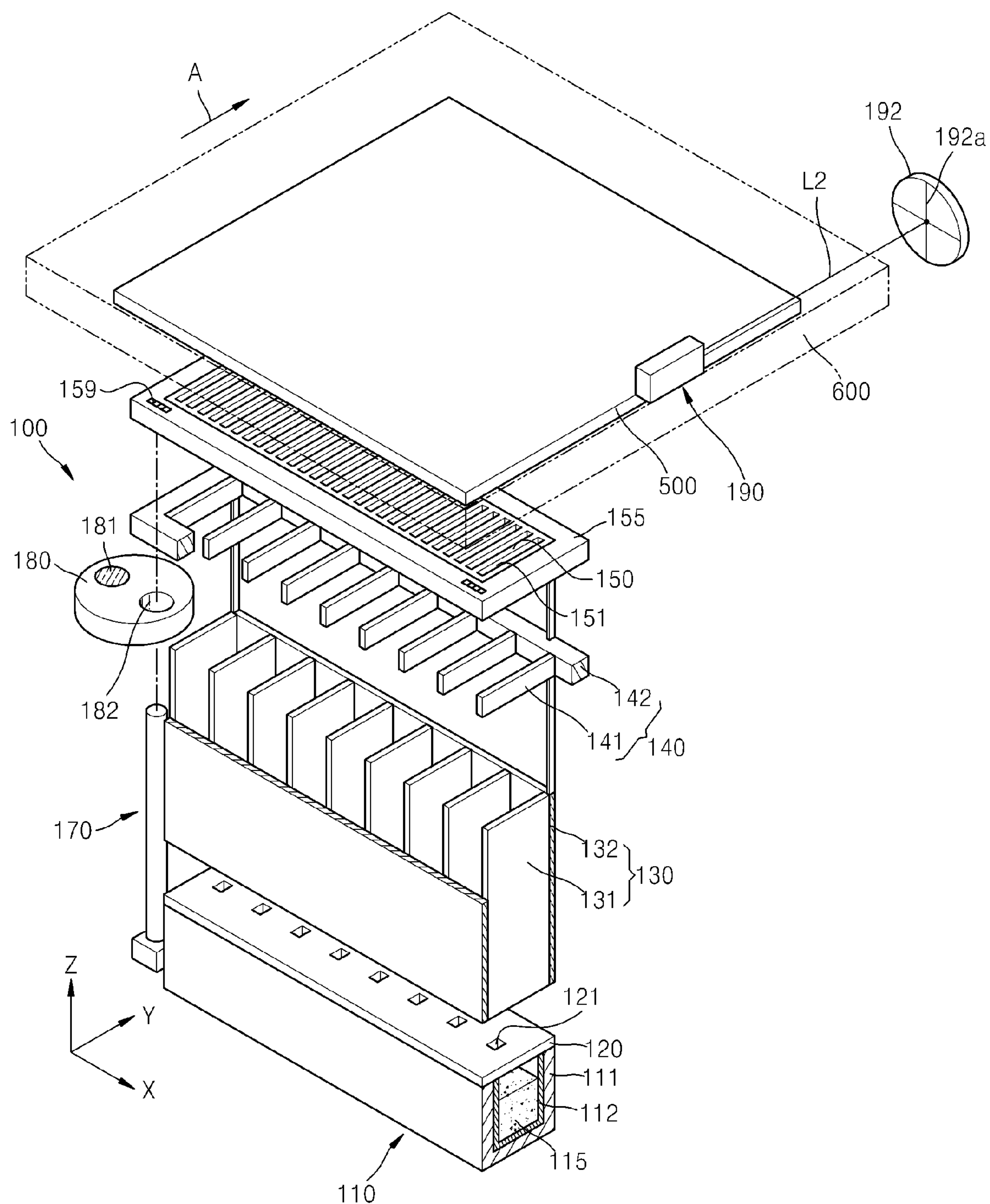
FIG. 14 is a schematic perspective view of a thin film deposition assembly according to another embodiment of the present invention.

FIG. 14 is a schematic perspective view of a thin film deposition assembly 100 according to an embodiment of the present invention.

Referring to FIG. 14, the thin film deposition assembly 100 according to the current embodiment of the present invention includes a deposition source 110, a deposition source nozzle unit 120, a first barrier plate assembly 130, a second barrier plate assembly 140, and a patterning slit sheet 150.

Although a chamber is not illustrated in FIG. 14 for convenience of explanation, all the components of the thin film deposition assembly 100 may be disposed within a chamber that is maintained at an appropriate degree of vacuum, such as, for example, the first vacuum chamber 731 or the second vacuum chamber 732 of FIGS. 1 and 2. The chamber is maintained at an appropriate vacuum in order to allow a deposition material to move in a substantially straight line through the thin film deposition apparatus 100.

The substrate 500, which constitutes a deposition target on which a deposition material 115 is to be deposited, is disposed in the chamber. The deposition source 110 that contains and heats the deposition material 115 is disposed in an opposite side of the chamber to a side in which the substrate 500 is disposed.

Structures of the deposition source 110 and the patterning slit sheet 150 are the same as those in the embodiment described with reference to FIG. 4, and thus a detailed description thereof will not be repeated here. The first barrier plate assembly 130 is also the same as the barrier plate assembly 130 of the embodiment described with reference to FIG. 4, and thus a detailed description thereof will not be repeated here.

The second barrier plate assembly 140 is disposed at a side of the first barrier plate assembly 130. The second barrier plate assembly 140 includes a plurality of second barrier plates 141, and a second barrier plate frame 142 that covers sides of the second barrier plates 141.

The plurality of second barrier plates 141 may be arranged parallel to each other at equal intervals in the X-axis direction. In addition, each of the second barrier plates 141 may be formed to extend parallel to the YZ plane in FIG. 10, i.e., perpendicular to the X-axis direction.

The plurality of first barrier plates 131 and second barrier plates 141 arranged as described above partition the space between the deposition source nozzle unit 120 and the patterning slit sheet 150. The deposition space is divided by the first barrier plates 131 and the second barrier plates 141 into sub-deposition spaces that respectively correspond to the deposition source nozzles 121 through which the deposition material 115 is discharged.

The second barrier plates 141 may be disposed to correspond respectively to the first barrier plates 131. In other words, the second barrier plates 141 may be respectively disposed to be parallel to and to be on the same plane as the first barrier plates 131. Each pair of the corresponding first and second barrier plates 131 and 141 may be located on the same plane. Although the first barrier plates 131 and the second barrier plates 141 are respectively illustrated as having the same thickness in the X-axis direction, aspects of the present invention are not limited thereto. In other words, the second barrier plates 141, which may need to be accurately aligned with the patterning slits 151, may be formed to be relatively thin, whereas the first barrier plates 131, which do not need to be precisely aligned with the patterning slits 151, may be formed to be relatively thick. This makes it easier to manufacture the thin film deposition assembly.

As illustrated in FIG. 1, a plurality of thin film deposition assemblies, which each have the same structure as the thin film deposition assembly 100 of FIG. 14 described above, may be successively disposed in the first chamber 731. In this case, the thin film deposition assemblies 100, 200, 300 and 400 may be used to deposit different deposition materials, respectively. For example, the thin film deposition assemblies 100, 200, 300 and 400 may have different patterning slit patterns, so that pixels of different colors, for example, red, green and blue, may be simultaneously defined through a film deposition process.

The thin film deposition assembly 100 according to the current embodiment may also further include a position detection member including a camera 170, a focus control member 180 and a laser irradiation member 190, and an alignment control member including an actuator (see FIGS. 12 and 13), and thus the substrate 500 may be accurately and easily aligned with the thin film deposition assembly 100. This structure is described in the previous embodiment, and a detailed description thereof will not be repeated here.

Figure 15:
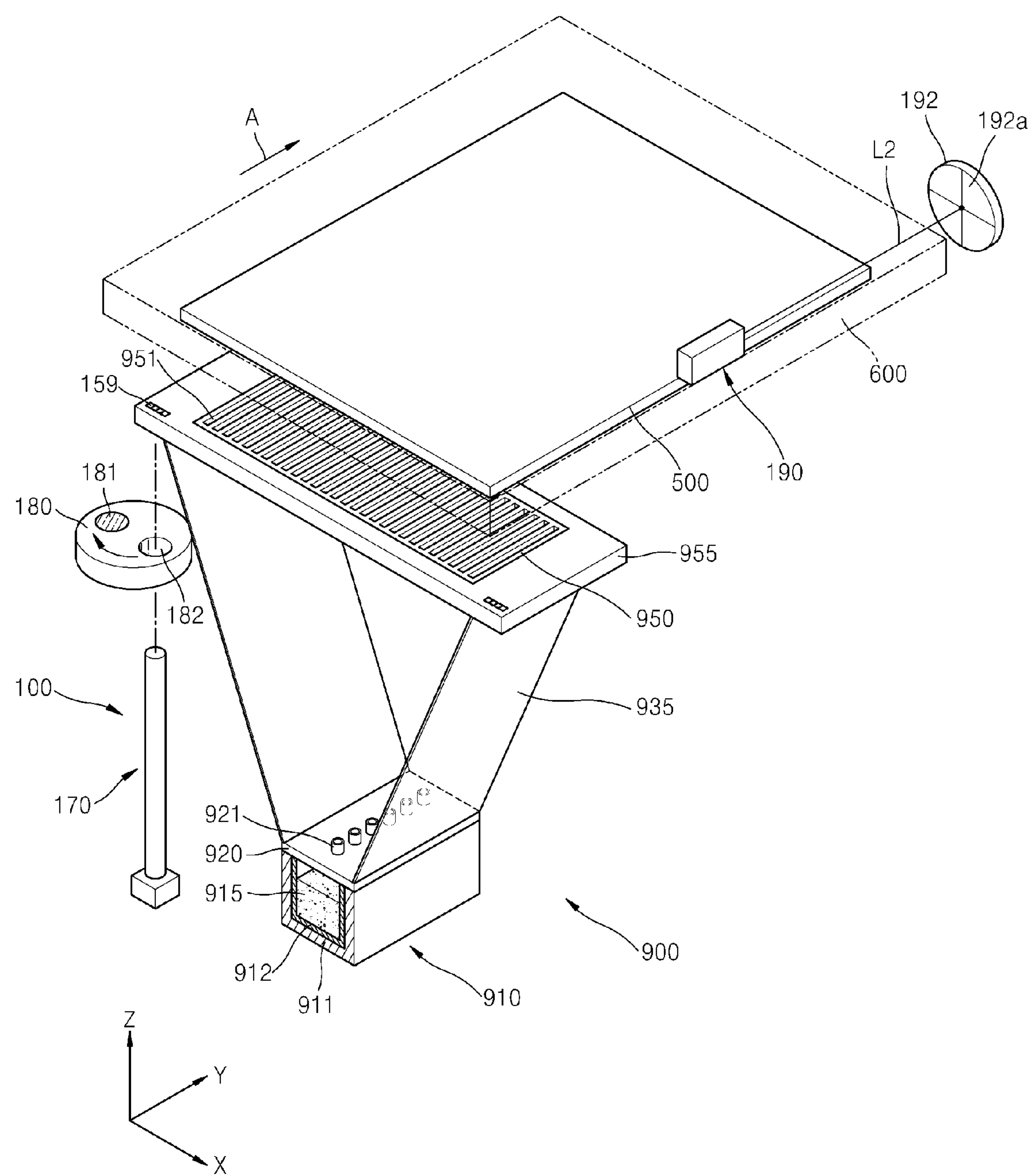
FIG. 15 is a schematic perspective view of a thin film deposition assembly according to another embodiment of the present invention.

FIG. 15 is a schematic perspective view of a thin film deposition assembly 900 according to another embodiment of the present invention.

Referring to FIG. 15, the thin film deposition assembly 900 according to the current embodiment includes a deposition source 910, a deposition source nozzle unit 920, and a patterning slit sheet 950.

Although a chamber is not illustrated in FIG. 15 for convenience of explanation, all the components of the thin film deposition assembly 900 may be disposed within a chamber that is maintained at an appropriate degree of vacuum, such as, for example, the first vacuum chamber 731 or the second vacuum chamber 732 shown in FIGS. 1 and 2. The chamber is maintained at an appropriate vacuum in order to allow a deposition material to move in a substantially straight line through the thin film deposition apparatus 100.

The substrate 500, which constitutes a deposition target on which a deposition material 915 is to be deposited, is transferred by an electrostatic chuck 600 in the chamber. The substrate 500 may be a substrate for flat panel displays. A large substrate, such as a mother glass, for manufacturing a plurality of flat panel displays, may be used as the substrate 500. Other substrates may also be employed.

In the current embodiment of the present invention, deposition may be performed while the substrate 500 and the thin film deposition assembly 900 are moved relative to each other. In particular, deposition may be continuously performed while the substrate 500, which is disposed such as to face the thin film deposition assembly 900, is moved in a Y-axis direction. In other words, deposition may be performed in a scanning manner while the substrate 500 is moved in a direction of arrow A in FIG. 15. Although the substrate 500 is illustrated as being moved in the Y-axis direction of the chamber in FIG. 15 when deposition is performed, the present invention is not limited thereto. Deposition may be performed while the thin film deposition assembly 900 is moved in the Y-axis direction, while the substrate 500 is held in a fixed position.

Thus, in the thin film deposition assembly 900 according to the current embodiment of the present invention, the patterning slit sheet 950 may be significantly smaller than an FMM used in a conventional deposition method. In other words, in the thin film deposition assembly 900 according to the current embodiment of the present invention, deposition is continuously performed, i.e., in a scanning manner while the substrate 500 is moved in the Y-axis direction. Thus, lengths of the patterning slit sheet 950 in the X-axis and Y-axis directions may be significantly less than the lengths of the substrate 500 in the X-axis and Y-axis directions. As described above, since the patterning slit sheet 950 may be formed to be significantly smaller than an FMM used in a conventional deposition method, it is relatively easy to manufacture the patterning slit sheet 950 used in aspects of the present invention. In other words, using the patterning slit sheet 950, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition assembly 900 and the substrate 500 are moved relative to each other as described above, the thin film deposition assembly 900 and the substrate 500 may be spaced apart from each other by a predetermined distance. This will be described later in detail.

The deposition source 910 that contains and heats the deposition material 915 is disposed in an opposite side of the chamber to a side in which the substrate 500 is disposed. After being vaporized in the deposition source 910, the deposition material 115 is deposited on the substrate 500.

In particular, the deposition source 910 includes a crucible 911 that is filled with the deposition material 915, and a heater 911 that heats the crucible 911 to vaporize the deposition material 915, which is contained in the crucible 911, towards a side of the crucible 912, and in particular, towards the deposition source nozzle unit 920.

The deposition source nozzle unit 920 is disposed at a side of the deposition source 910, and in particular, at the side of the deposition source 910 facing the substrate 500. The deposition source nozzle unit 920 includes a plurality of deposition source nozzles 921 arranged at equal intervals in the Y-axis direction, i.e., a scanning direction of the substrate 500. The deposition material 915 that is vaporized in the deposition source 910, passes through the deposition source nozzle unit 920 towards the substrate 500. As described above, when the deposition source nozzle unit 920 includes the plurality of deposition source nozzles 921 arranged in the Y-axis direction, that is, the scanning direction of the substrate 500, the size of a pattern formed of the deposition material discharged through the patterning slits 950 of the patterning slit sheet 951 is affected by the size of one of the deposition source nozzles 921 (since there is only one line of deposition nozzles in the X-axis direction), and thus no shadow zone may be formed on the substrate 500. In addition, since the plurality of deposition source nozzles 921 are arranged in the scanning direction of the substrate 400, even there is a difference in flux between the deposition source nozzles 921, the difference may be compensated for and deposition uniformity may be maintained constant.

The patterning slit sheet 950 and a frame 955 in which the patterning slit sheet 950 is bound are disposed between the deposition source 910 and the substrate 500. The frame 955 may be formed in a lattice shape, similar to a window frame. The patterning slit sheet 950 is bound inside the frame 955. The patterning slit sheet 950 includes a plurality of patterning slits 951 arranged in the X-axis direction. The deposition material 915 that is vaporized in the deposition source 910, passes through the deposition source nozzle unit 920 and the patterning slit sheet 950 towards the substrate 500. The patterning slit sheet 950 may be manufactured by etching, which is the same method as used in a conventional method of manufacturing an FMM, and in particular, a striped FMM. In this regard, the total number of patterning slits 951 may be greater than the total number of deposition source nozzles 921.

In addition, the deposition source 910 and the deposition source nozzle unit 920 coupled to the deposition source 910 may be disposed to be separated from the patterning slit sheet 950 by a predetermined distance. Alternatively, the deposition source 910 and the deposition source nozzle unit 920 coupled to the deposition source 910 may be connected to the patterning slit sheet 950 by a connection member 935. That is, the deposition source 910, the deposition source nozzle unit 920, and the patterning slit sheet 950 may be integrally formed as one body by being connected to each other via the connection member 935. The connection member 935 guides the deposition material 915, which is discharged through the deposition source nozzles 921, to move straight, not to deviate in the X-axis direction. In FIG. 15, the connection members 935 are formed on left and right sides of the deposition source 910, the deposition source nozzle unit 920, and the patterning slit sheet 950 to guide the deposition material 915 not to flow in the X-axis direction; however, aspects of the present invention are not limited thereto. That is, the connection member 935 may be formed as a sealed box to guide flow of the deposition material 915 in both the X-axis and Y-axis directions.

As described above, the thin film deposition assembly 900 according to the current embodiment of the present invention performs deposition while being moved relative to the substrate 500. In order to move the thin film deposition assembly 900 relative to the substrate 500, the patterning slit sheet 950 is spaced apart from the substrate 500 by a predetermined distance.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the mask has to be the same size as the substrate since the mask cannot be moved relative to the substrate. Thus, the size of the mask has to be increased when a larger display device is produced. However, it is not easy to manufacture such a large mask.

In order to overcome this problem, in the thin film deposition assembly 900 according to the current embodiment of the present invention, the patterning slit sheet 950 is disposed to be separated from the substrate 500 by a predetermined distance.

As described above, according to aspects of the present invention, a mask is formed to be smaller than a substrate, and deposition is performed while the mask is moved relative to the substrate. Thus, the mask can be easily manufactured. In addition, defects caused due to the contact between a substrate and an FMM, which occur in the conventional deposition method, may be prevented. In addition, since it is unnecessary to use the FMM in close contact with the substrate during a deposition process, the manufacturing time may be reduced.

The thin film deposition assembly 900 according to the current embodiment may also further include a position detection member including a camera 170, a focus control member 180 and a laser irradiation member 190, and an alignment control member including an actuator (see FIGS. 12 and 13), and thus the substrate 500 may be accurately and easily aligned with the thin film deposition assembly 900. This structure is described in the embodiment described above with reference to FIG. 4, and a detailed description thereof will not be repeated here.

Figure 16:
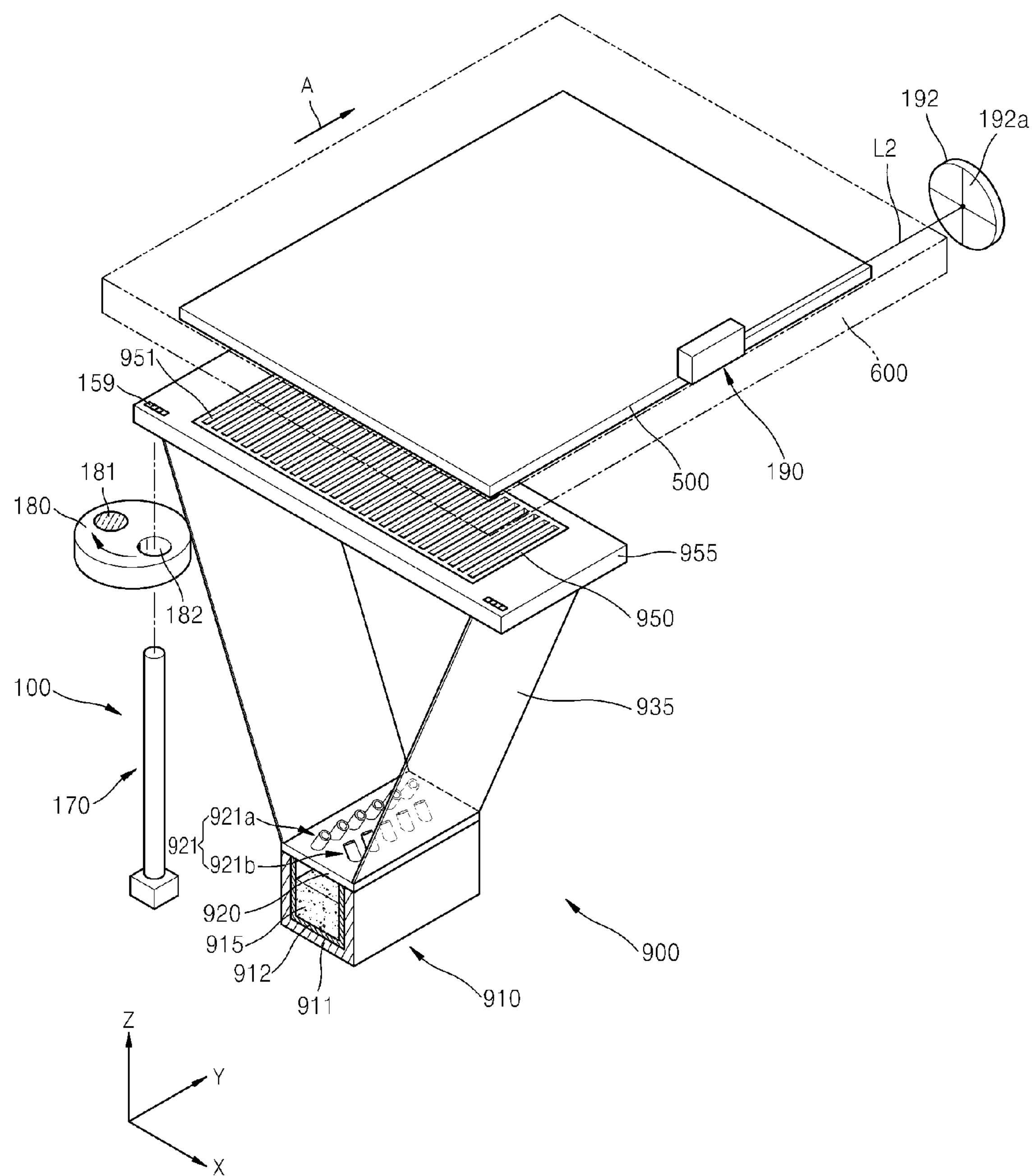
FIG. 16 is a schematic perspective view of a thin film deposition assembly according to an embodiment of the present invention.

FIG. 16 is a schematic perspective view of a thin film deposition apparatus 900 according to another embodiment of the present invention. Referring to FIG. 9, the thin film deposition apparatus 900 according to the current embodiment includes a deposition source 910, a deposition source nozzle unit 920, and a patterning slit sheet 950. In particular, the deposition source 910 includes a crucible 911 that is filled with the deposition material 915, and a heater 911 that heats the crucible 911 to vaporize the deposition material 915, which is contained in the crucible 912, towards a side of the crucible 911 towards the deposition source nozzle unit 920. The deposition source nozzle unit 920, which has a planar shape, is disposed at a side of the deposition source 910. The deposition source nozzle unit 920 includes a plurality of deposition source nozzles 921 arranged in the Y-axis direction. The patterning slit sheet 950 and a frame 955 are further disposed between the deposition source 910 and the substrate 500. The patterning slit sheet 950 includes a plurality of patterning slits 951 arranged in the X-axis direction. In addition, the deposition source 910 and the deposition source nozzle unit 920 may be connected to the patterning slit sheet 950 by the connection member 935.

In the current embodiment, a plurality of deposition source nozzles 921 formed in the deposition source nozzle unit 920 are tilted at a predetermined angle, unlike the embodiment described with reference to FIG. 15. In particular, the deposition source nozzles 921 may include deposition source nozzles 921*a* and 921*b* arranged in respective rows. The deposition source nozzles 921*a* and 921*b* may be arranged in respective rows to alternate in a zigzag pattern. The deposition source nozzles 921*a* and 921*b* may be tilted by a predetermined angle with respect to an XZ plane.

Therefore, in the current embodiment of the present invention, the deposition source nozzles 921*a* and 921*b* are arranged to tilt by a predetermined angle to each other. For example, the deposition source nozzles 921*a* of a first row and the deposition source nozzles 921*b* of a second row may tilt at the predetermined angle to face each other. That is, the deposition source nozzles 921*a* of the first row in a left part of the deposition source nozzle unit 920 may tilt to face a right side portion of the patterning slit sheet 950, and the deposition source nozzles 921*b* of the second row in a right part of the deposition source nozzle unit 920 may tilt to face a left side portion of the patterning slit sheet 950.

Figure 17:
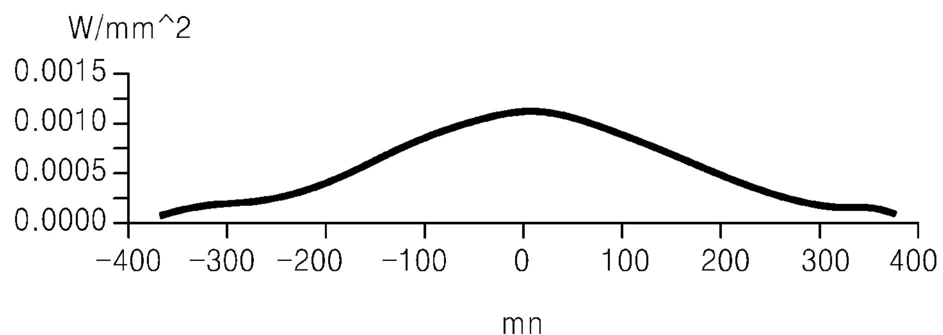
FIG. 17 is a graph schematically illustrating a distribution pattern of a deposition film formed on a substrate when deposition source nozzles are not tilted in the thin film deposition assembly of FIG. 16.
Figure 18:
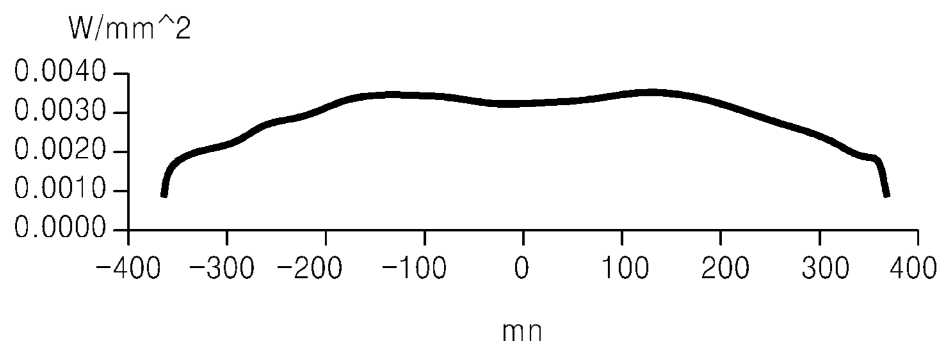
FIG. 18 is a graph schematically illustrating a distribution pattern of a deposition film formed on a substrate when the deposition source nozzles are tilted in the thin film deposition assembly of FIG. 11.

FIG. 17 is a graph showing a distribution of a deposition film formed on the substrate 500 when the deposition source nozzles 921*a* and 921*b* are not tilted, in the thin film deposition assembly 900 according to the current embodiment of the present invention, and FIG. 18 is a graph showing a distribution of a deposition film formed on the substrate 500 when the deposition source nozzles 921*a* and 921*b* are tilted, in the thin film deposition assembly 900. Comparing the graphs of FIGS. 17 and 18 with each other, thickness of the deposition film formed on opposite end portions of the substrate 500 when the deposition source nozzles 921*a* and 921*b* are tilted is relatively greater than that of the deposition film formed on the substrate 500 when the deposition source nozzles 921*a* and 921*b* are not tilted, and thus, the uniformity of the deposition film is improved.

Due to the structure of the thin film deposition assembly 900 according to the current embodiment, the deposition of the deposition material 915 may be adjusted to lessen a thickness variation between the center and the end portions of the substrate 500 and improve thickness uniformity of the deposition film. Moreover, utilization efficiency of the deposition material 915 may also be improved.

The thin film deposition assembly 900 according to the current embodiment may also further include a position detection member including a camera 170, a focus control member 180 and a laser irradiation member 190, and an alignment control member including an actuator (see FIGS. 12 and 13), and thus the substrate 500 may be accurately and easily aligned with the thin film deposition assembly 900. This structure is described in the embodiment with reference to FIG. 4, and a detailed description thereof will not be repeated here.

Figure 19:
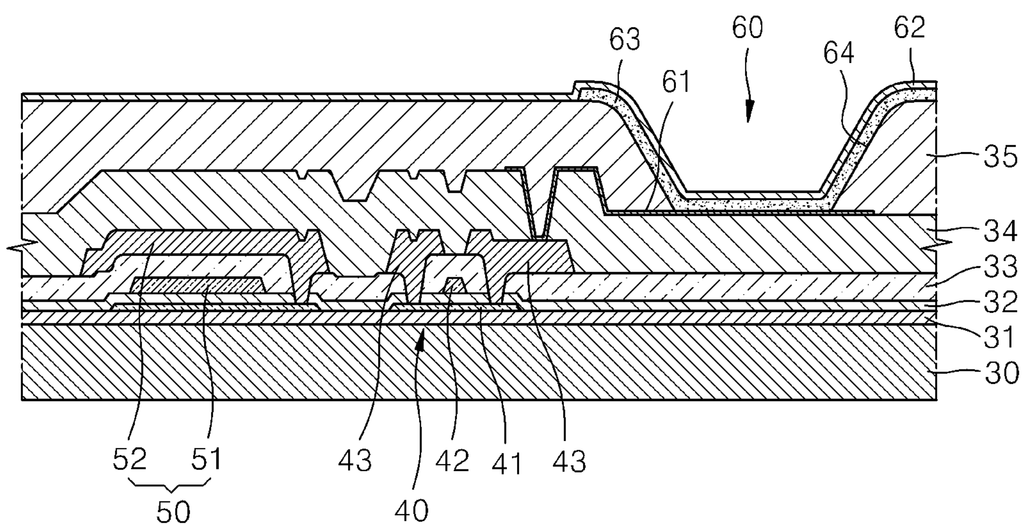
FIG. 19 is a cross-sectional view of an active matrix organic light-emitting display device fabricated by using a thin film deposition apparatus, according to an embodiment of the present invention.

FIG. 19 is a cross-sectional view of an active matrix organic light-emitting display device fabricated by using a thin film deposition apparatus, according to an embodiment of the present invention. It is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

Referring to FIG. 19, the active matrix organic light-emitting display device according to the current embodiment is formed on a substrate 30. The substrate 30 may be formed of a transparent material, such as, for example, glass, plastic or metal. An insulating layer 31, such as a buffer layer, is formed on an entire surface of the substrate 30.

A thin film transistor (TFT) 40, a capacitor 50, and an organic light-emitting diode (OLED) are disposed on the insulating layer 31, as illustrated in FIG. 19.

A semiconductor active layer 41 is formed on an upper surface of the insulating layer 31 in a predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

A source/drain electrode 43 is formed on the interlayer insulating layer 33 to contact the semiconductor active layer 41 through the contact hole. A passivation layer 34 is formed to cover the source/drain electrode 43, and is etched to expose a part of the drain electrode 43. An insulating layer (not shown) may be further formed on the passivation layer 34 so as to planarize the passivation layer 34.

In addition, the OLED 60 displays predetermined image information by emitting red, green, or blue light according to a flow of current. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening 64 is formed in the pixel defining layer 35, and an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic emission layer 63 to induce light emission.

The organic emission layer 63 may be formed of a low-molecular weight organic material or a high-molecular weight organic material. When a low-molecular weight organic material is used, the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. Such a low-molecular weight organic material may be deposited using vacuum deposition by using one of the thin film deposition apparatuses described above with reference to FIG. 4.

After the organic emission layer 63 is formed, the second electrode 62 may be formed by the same deposition method as used to form the organic emission layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed as a common electrode to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic emission layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic emission layer 63. The second electrode 62 may be formed by using the same deposition method as used to form the organic emission layer 63 described above.

The thin film deposition apparatuses according to the embodiments of the present invention described above may be applied to form an organic layer or an inorganic layer of an organic TFT, and to form layers from various materials. In particular, the thin film deposition assemblies according to the embodiments of the present invention may be used to form one or more layers of an active matrix (AM) organic light-emitting display device. It is to be understood that the active matrix (AM) organic light-emitting display device may vary from what is described above.

As described above, the thin film deposition apparatus according to aspects of the present invention may be easily manufactured and may be simply applied to produce large-sized display devices on a mass scale. The thin film deposition apparatus may improve manufacturing yield and deposition efficiency and may allow deposition materials to be reused.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film deposition apparatus for forming a thin film on a substrate, the apparatus comprising:

a deposition source that discharges a deposition material;

a deposition source nozzle unit disposed at a side of the deposition source and including a plurality of deposition source nozzles arranged in a first direction;

a patterning slit sheet disposed opposite to and spaced apart from the deposition source nozzle unit and including a plurality of patterning slits arranged in a second direction perpendicular to the first direction;

a position detection member that detects a relative position of the substrate to the patterning slit sheet and including a single camera utilized to measure both distance and alignment between the patterning slit sheet and the substrate; and an alignment control member that controls a relative position of the patterning slit sheet to the substrate by using the relative position of the substrate detected by the position detection member, wherein a deposition is performed and the relative position is detected while the substrate is separated from the patterning slit sheet of the thin film deposition apparatus by a set distance and the substrate or the patterning slit sheet of the thin film deposition apparatus is moved relative to the other in the first direction, and wherein the deposition material from the deposition source nozzle unit is patterned on the substrate by the patterning slit sheet.

2. The thin film deposition apparatus of claim 1, wherein the patterning slit sheet comprises a first alignment mark and the camera takes images of the first alignment mark and a second alignment mark on the substrate.

3. The thin film deposition apparatus of claim 2, wherein the position detection member is configured to utilize the second alignment mark that comprises at least one stripe that is substantially parallel to a direction in which the substrate is moved, for position detection.

4. A thin film deposition apparatus for forming a thin film on a substrate, the apparatus comprising:

a deposition source that discharges a deposition material;

a deposition source nozzle unit disposed at a side of the deposition source and including a plurality of deposition source nozzles arranged in a first direction;

a patterning slit sheet disposed opposite to and spaced apart from the deposition source nozzle unit and including a plurality of patterning slits arranged in a second direction perpendicular to the first direction;

a position detection member that detects a relative position of the substrate to the patterning slit sheet;

an alignment control member including a camera, the alignment control member controls a relative position of the patterning slit sheet to the substrate by using the relative position of the substrate detected by the position detection member; and a focus control member disposed between the camera and the patterning slit sheet to control a focal point of the camera to alternately be on the substrate and the patterning slit sheet, wherein a deposition is performed and the relative position is detected while the substrate or the thin film deposition apparatus is moved relative to the other in the first direction.

5. The thin film deposition apparatus of claim 4, wherein the focus control member is disposed to be rotatable, and comprises a first hole and a second hole that have different refractive indices.

6. The thin film deposition apparatus of claim 5, wherein one of the first hole and the second hole is filled with a transparent material.

7. The thin film deposition apparatus of claim 5, wherein the focus control member is disposed in such a way that the first hole and the second hole alternate on an optical axis of the camera.

8. The thin film deposition apparatus of claim 1, wherein the camera controls a focal point of the camera by reciprocating along an optical axis of the camera.

9. The thin film deposition apparatus of claim 1, wherein the position detection member further comprises:

a laser irradiation member that irradiates a laser beam in a direction substantially parallel to a direction in which the substrate is moved; and at least one measurement member coaxially disposed with the laser beam irradiated from the laser irradiation member and comprising a third alignment mark.

10. The thin film deposition apparatus of claim 1, wherein the alignment control member comprises at least two first actuators providing a predetermined driving force to move the patterning slit sheet relative to the substrate in the first direction.

11. The thin film deposition apparatus of claim 1, wherein the alignment control member comprises at least three second actuators providing a predetermined driving force to move the patterning slit sheet relative to the substrate in a direction perpendicular to a deposition surface of the substrate.

12. The thin film deposition apparatus of claim 1, wherein the deposition source, the deposition source nozzle unit, and the patterning slit sheet are integrally connected as one body by a connection member.

13. The thin film deposition apparatus of claim 12, wherein the connection member guides a flow path of the deposition material.

14. The thin film deposition apparatus of claim 12, wherein the connection member seals a space between the deposition source nozzle unit disposed at the side of the deposition source, and the patterning slit sheet.

15. The thin film deposition apparatus of claim 1, wherein the thin film deposition apparatus is separated from the substrate by a predetermined distance.

16. The thin film deposition apparatus of claim 1, wherein the patterning slit sheet of the thin film deposition apparatus is smaller than the substrate.

17. The thin film deposition apparatus of claim 1, wherein the plurality of deposition source nozzles are tilted at a predetermined angle.

18. The thin film deposition apparatus of claim 17, wherein the plurality of deposition source nozzles include deposition source nozzles arranged in two rows formed in the first direction, and the deposition source nozzles in the two rows are tilted to face each other.

19. The thin film deposition apparatus of claim 17, wherein the plurality of deposition source nozzles include deposition source nozzles arranged in two rows formed in the first direction, wherein the deposition source nozzles of a row located at a first side of the patterning slit sheet are arranged to face a second side of the patterning slit sheet, and the deposition source nozzles of the other row located at the second side of the patterning slit sheet are arranged to face the first side of the patterning slit sheet.

* * * * *